US012808051B2

(12) United States Patent
Kiyosawa et al.

(10) Patent No.: US 12,808,051 B2
(45) Date of Patent: Nov. 24, 2026

(54) FILM FORMATION METHOD, WAFER SUPPORT STRUCTURE, AND VAPOR PHASE GROWTH APPARATUS

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tsutomu Kiyosawa, Himeji Hyogo (JP); Masaharu Shimabayashi, Ibo Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 19/056,830

(22) Filed: Feb. 19, 2025

(65) Prior Publication Data

US 2026/0078491 A1 Mar. 19, 2026

(30) Foreign Application Priority Data

Sep. 18, 2024 (JP) ................................ 2024-161003

(51) Int. Cl.

*C23C 16/458* (2006.01)
*H10P 72/50* (2026.01)
*H10P 72/76* (2026.01)

(52) U.S. Cl.

CPC ...... *C23C 16/4585* (2013.01); *C23C 16/4584* (2013.01); *H10P 72/7614* (2026.01); *H10P 72/50* (2026.01)

(58) Field of Classification Search

CPC ............. H10P 72/7612; H10P 72/7614; H10P 72/7608; H10P 72/76; H10P 72/50; C23C 16/4585

See application file for complete search history.

(56) References Cited

U.S. PATENT DOCUMENTS 5,192,087 A * 3/1993 Kawashima ........ B23B 31/1612 118/503
5,695,568 A * 12/1997 Sinha .................. C23C 16/4412 118/728

(Continued)

FOREIGN PATENT DOCUMENTS

JP 2010272550 A 12/2010
JP 5205737 B2 6/2013

(Continued)

OTHER PUBLICATIONS

Okada et al. WO-2012172920-A1. Substrate Support Apparatus and Vapour-Phase Deposition Apparatus. Machine Translation (Year: 2012).*

*Primary Examiner* — Tyrone V Hall, Jr.
(74) *Attorney, Agent, or Firm* — Maier & Maier, PLLC

(57) ABSTRACT

A film formation method of an embodiment is a film formation method for forming a film on a surface of a wafer using a vapor phase growth apparatus. The film formation method of the embodiment includes film formation processing of forming a film on a surface of the wafer. The vapor phase growth apparatus has a susceptor and a plurality of wafer guide portions. The susceptor supports the wafer and is rotated around a rotation axis extending in a vertical direction. The plurality of wafer guide portions are disposed with an interval therebetween in a circumferential direction around the rotation axis, protrude upward beyond the susceptor, and surround the wafer.

7 Claims, 15 Drawing Sheets

(56) References Cited

U.S. PATENT DOCUMENTS

| | | | |
|---|---|---|---|
| 8,419,001 | B2 | 4/2013 | Ono et al. |
| 10,818,538 | B2 | 10/2020 | Mashimo et al. |

FOREIGN PATENT DOCUMENTS

| | | | | | |
|---|---|---|---|---|---|
| JP | 2024017276 | A | | 2/2024 | |
| WO | WO-2012172920 | A1 | * | 12/2012 | .......... H10P 72/7614 |

* cited by examiner

FILM FORMATION METHOD, WAFER SUPPORT STRUCTURE, AND VAPOR PHASE GROWTH APPARATUS

CROSS-REFERENCE TO RELATED APPLICATION

Priority is claimed on Japanese Patent Application No. 2024-161003, filed Sep. 18, 2024, the content of which is incorporated herein by reference.

FIELD

An embodiment of the present invention relates to a film formation method, a wafer support structure, and a vapor phase growth apparatus.

BACKGROUND

Vapor phase growth apparatus for forming a film on a surface of a wafer supported by a support member from below are known. In such vapor phase growth apparatus, wafer guides are disposed around a wafer supported by a support surface. The wafer guides are formed to have the same height as the surface of the wafer or be higher than the surface of the wafer such that the wafer does not fly out when the support member rotates.

For this reason, during film formation processing of forming a film on a surface of a wafer, a flow of gas containing a supplied source gas may be hindered by the wafer guides so that film formation characteristics such as the film thickness at the outermost circumference of a wafer or carrier concentration distribution may deteriorate.

DETAILED DESCRIPTION

Figure 1:
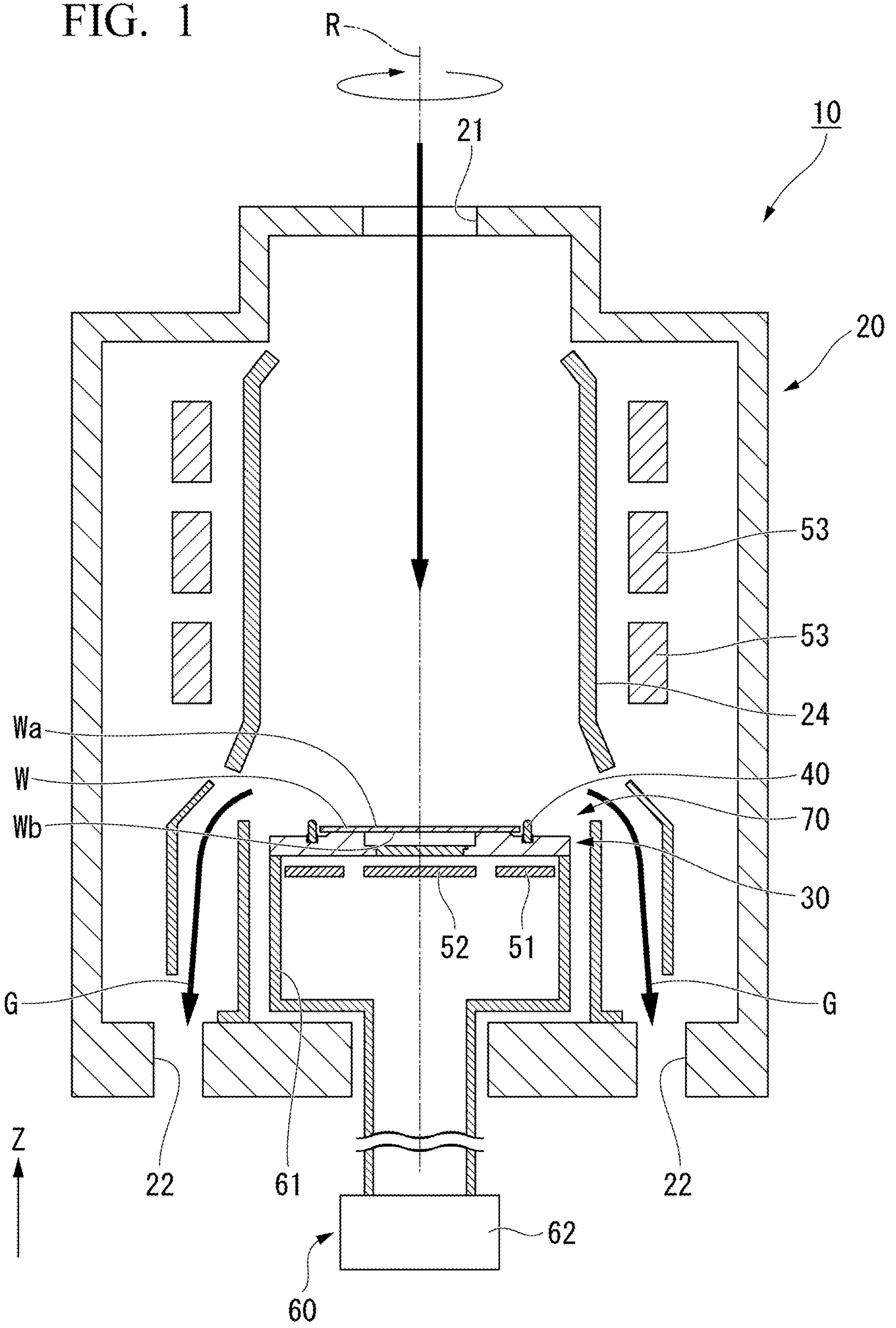
FIG. 1 is a cross-sectional view showing a vapor phase growth apparatus of a first embodiment.

A film formation method of an embodiment is a film formation method for forming a film on a surface of a wafer using a vapor phase growth apparatus. The film formation method of the embodiment includes film formation processing of forming a film on a surface of the wafer. The vapor phase growth apparatus has a susceptor and a plurality of wafer guide portions. The susceptor supports the wafer and is rotated around a rotation axis extending in a vertical direction. The plurality of wafer guide portions are disposed with an interval therebetween in a circumferential direction around the rotation axis, protrude upward beyond the susceptor, and surround the wafer. The film formation processing includes surrounding the wafer with the plurality of wafer guide portions such that each direction in which the rotation axis and each of the wafer guide portions are connected when viewed in the vertical direction becomes different from a cleavage direction in the wafer.

Hereinafter, a film formation method, a wafer support structure, and a vapor phase growth apparatus of an embodiment will be described with reference to the drawings. In the drawings, a Z axis indicating a vertical direction is suitably indicated. A side which the Z axis arrow faces (positive Z side) is an upward side in the vertical direction, and a side opposite to the side which the Z axis arrow faces (negative Z side) is a downward side in the vertical direction. In the following description, the vertical direction will be referred to as “a vertical direction Z”, and the upward side in the vertical direction Z will be simply referred to as “the upward side”, and the downward side in the vertical direction Z will be simply referred to as “the downward side”. In addition, in the drawings, a rotation axis R extending in the vertical direction Z is suitably indicated. The rotation axis R is a virtual line. In the following description, unless otherwise specified, a radial direction about the rotation axis R will be simply referred to as “a radial direction”, and a circumferential direction around the rotation axis R will be simply referred to as “a circumferential direction”.

First Embodiment

Figure 2:
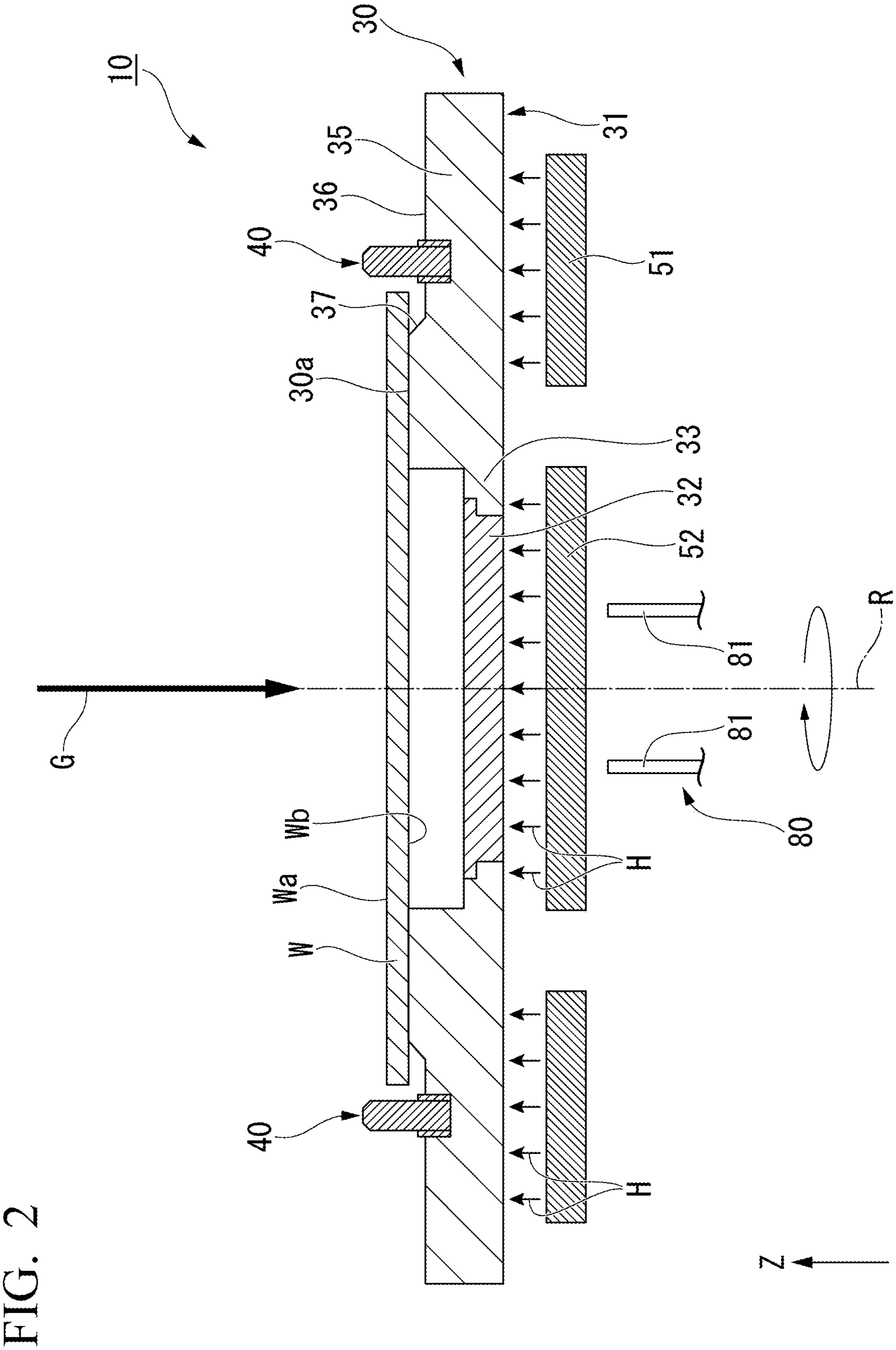
FIG. 2 is a cross-sectional view showing part of the vapor phase growth apparatus of the first embodiment.
Figure 3:
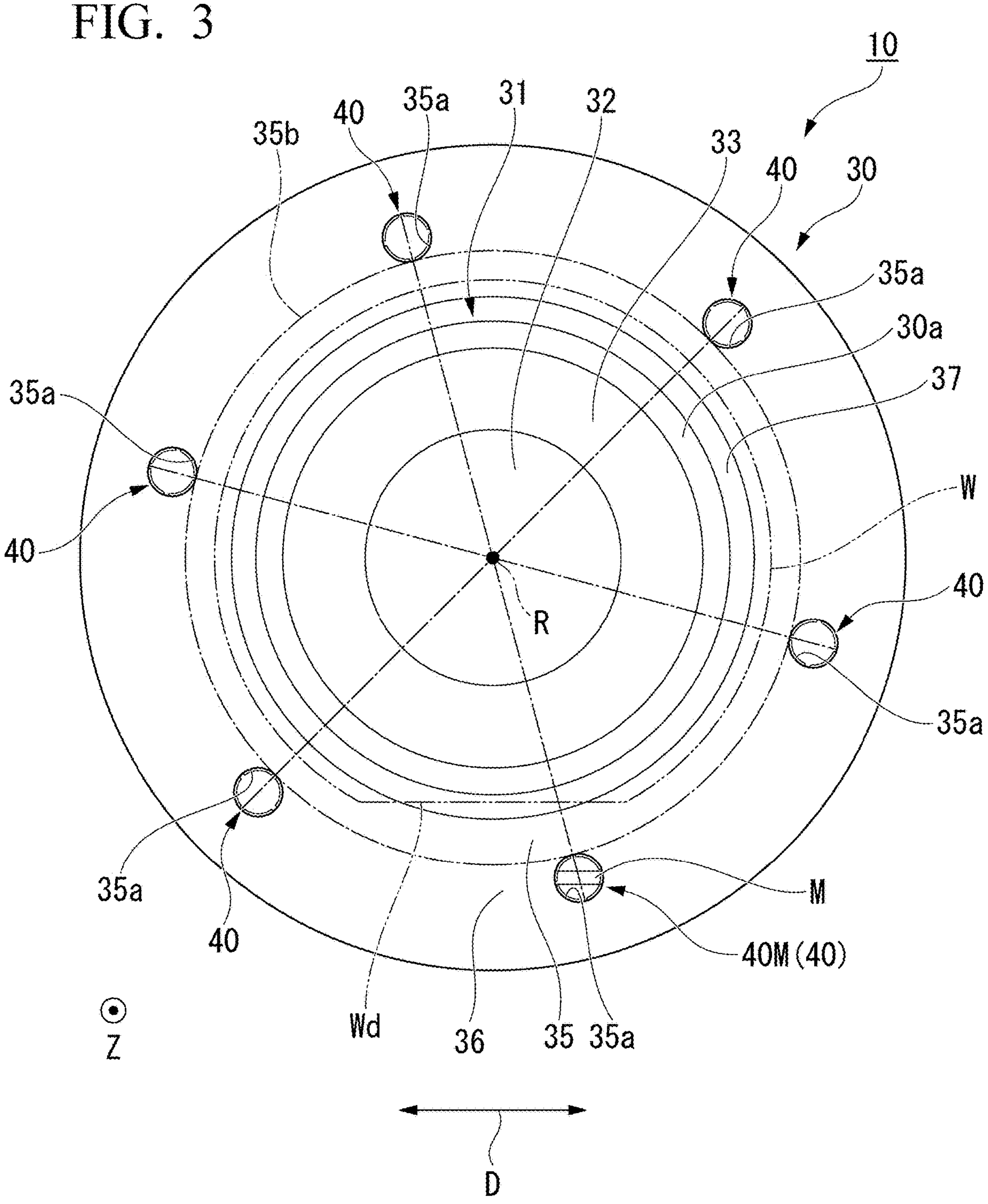
FIG. 3 is a view of part of the vapor phase growth apparatus of the first embodiment viewed from above.

FIG. 1 is a cross-sectional view showing a vapor phase growth apparatus 10 of a first embodiment. FIG. 2 is a cross-sectional view showing part of the vapor phase growth apparatus 10 of the first embodiment. FIG. 3 is a view of part of the vapor phase growth apparatus 10 of the first embodiment viewed from above. In FIG. 3, the outer shape of a wafer W is indicated by a two-dot dashed line. The vapor phase growth apparatus 10 shown in FIGS. 1 to 3 is an apparatus for forming a film on a surface of the wafer W. In the vapor phase growth apparatus 10, for example, an epitaxial film is formed on the surface of the wafer W by a chemical vapor deposition (CVD) method. For example, the film formed on the surface of the wafer W is a film constituted using silicon carbide (SiC), that is, a SiC film. The film formed on the surface of the wafer W may be a film constituted using a different material such as Si. In the first embodiment, the wafer W is formed of single crystal having a hexagonal crystal structure. For example, the wafer W is formed of silicon carbide (SiC). Namely, the wafer W is a SiC substrate. For example, a material forming the wafer W is 4H—SiC, 6H—SiC, or the like. The wafer W may be formed of a different material such as silicon (Si).

As shown in FIG. 3, the wafer W has substantially a disk shape. Part of an outer edge of the wafer W is an orientation flat portion Wd which extends linearly. Namely, in the first embodiment, the outer edge of the wafer W is provided with the orientation flat portion Wd. In the first embodiment, the orientation flat portion Wd extends in one of cleavage directions in the wafer W. "Cleavage directions" are directions in which the wafer W is likely to break and are directions which are determined by the structure of crystal constituting the wafer W. The cleavage directions in the wafer W are directions aligned with cleavage surfaces which are formed when the wafer W breaks in the cleavage directions.

Figure 4:
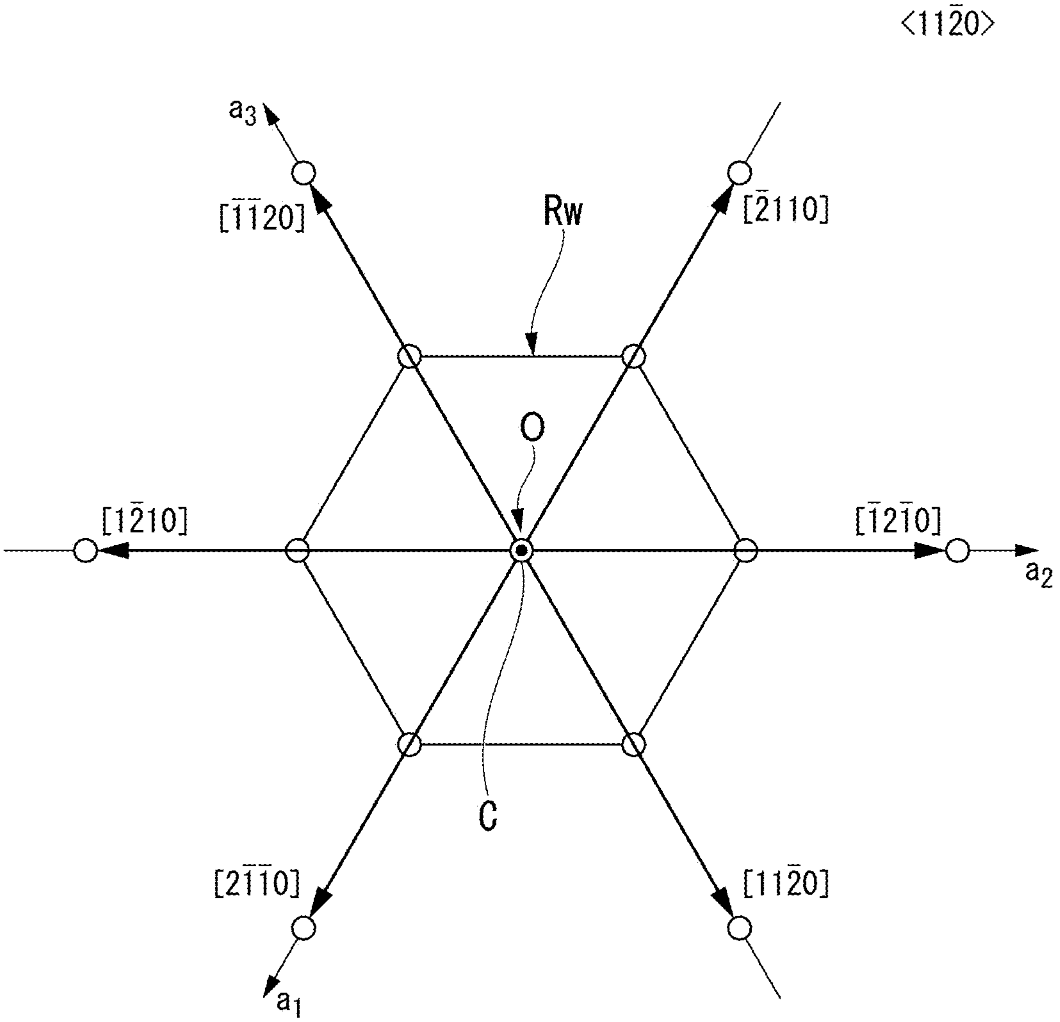
FIG. 4 is a view showing a base plane of a hexagonal crystal lattice forming a wafer.

FIG. 4 is a view showing a base plane of a hexagonal crystal lattice Rw forming the wafer W. As shown in FIG. 4, in the hexagonal crystal structure, directions indicated by four unit vectors, such as an a1 vector, an a2 vector, an a3 vector, and a c vector whose origins are the center of the base plane of the crystal lattice Rw, are represented by directional indices of Miller indices using a smallest integer ratio of the coefficient of each of the unit vectors. Here, the plate surface of the wafer W is a surface which is substantially aligned with a crystal plane represented by (0001) in plane indices of the Miller indices. In other words, the wafer W is a wafer formed of a substrate whose C plane of the crystal lattice represented by (0001) is substantially aligned with the plate surface of the wafer W, that is, a substrate whose orientation is C(0001). Here, a case where the plate surface of the wafer W is "substantially" aligned with the crystal plane represented by (0001) includes, for example, a case where the wafer W is a SiC substrate with an offset angle whose plate surface is offset with respect to the (0001) plane by several degrees in order to make the crystal structure of the epitaxially grown film stable. In the SiC with an offset angle, the offset angle is approximately 1° to 4°, for example. The a1 vector, the a2 vector, and the a3 vector are unit vectors whose orientations differ from each other by 120° and indicate directions toward respective atoms defining the outer circumference of the base plane of the crystal lattice Rw from an origin O. When the plate surface of the wafer W is substantially aligned with the crystal plane represented by (0001), the a1 vector, the a2 vector, and the a3 vector are vectors in directions which are substantially aligned with the plate surface of the wafer W. The sum of the coefficient of the a1 vector, the coefficient of the a2 vector, and the coefficient of the a3 vector becomes zero. The c vector is a unit vector indicating a height direction orthogonal to the a1 vector, the a2 vector, and the a3 vector. When the plate surface of the wafer W is substantially aligned with the crystal plane represented by (0001), the c vector is a vector in a direction substantially parallel to a plate thickness direction of the wafer W.

For example, in FIG. 4, the crystal orientation indicated by [11−20] indicates that the coefficient of the a1 vector, the coefficient of the a2 vector, the coefficient of the a3 vector, and the coefficient of the c vector are 1:1:−2:0. In the Miller indices, when the coefficient has a negative value, it is indicated by placing a bar above the numeral. However, in the description other than the drawings, when the coefficient has a negative value, it is indicated by placing "−" in front of the numeral instead of a bar above the numeral. FIG. 4 shows six crystal orientations, such as [11−20], [−12−10], [−2110], [−1−120], [1−210], and [2−1−10]. The six crystal orientations are directions equivalent to each other and are collectively represented by <11−20>. A crystal orientation which is equivalent to a certain crystal orientation is a crystal orientation that becomes the same direction as the certain crystal orientation and is indistinguishable from it when the crystal is rotated. In the hexagonal crystal system, the crystal orientations represented by <11−20> are directions in which the crystal is likely to break, that is, the cleavage directions. In the first embodiment, the orientation flat portion Wd extends in the crystal orientation of the wafer W represented by <11−20>. As shown in FIG. 3, part of the outer edge of the wafer W other than the orientation flat portion Wd has an arc shape. The wafer W is disposed inside the vapor phase growth apparatus 10 in a state where a surface Wa on which the film is formed faces upward and a rear surface Wb on a side opposite to the surface Wa faces downward. Even if the wafer W is a SiC substrate with an offset angle described above, the direction of <11−20> when viewed in the plate thickness direction of the wafer W does not differ or does not differ substantially from that when the wafer W is a SiC substrate with an offset angle of 0°.

As shown in FIG. 1, the vapor phase growth apparatus 10 includes a chamber 20, a supply tube 24, a susceptor 30, wafer guide portions 40, first heating portions 51, a second heating portion 52, third heating portions 53, and a drive unit 60. The susceptor 30 and the wafer guide portions 40 constitute a wafer support structure 70.

The chamber 20 internally accommodates the supply tube 24, the susceptor 30, the wafer guide portions 40, the first heating portions 51, the second heating portion 52, the third heating portions 53, and the drive unit 60. For example, the chamber 20 is made of metal such as stainless steel (SUS). The chamber 20 has a tubular shape extending in the vertical direction Z. A supply port 21 is formed in a top plate of the chamber 20. Discharge ports 22 are formed in a bottom portion of the chamber 20. Gas G containing a source gas for forming a film on the wafer W is supplied to the inside of the chamber 20 through the supply port 21.

The supply tube 24 has a tubular shape extending in the vertical direction Z. The supply tube 24 opens both upward and downward. The gas G supplied to the inside of the chamber 20 through the supply port 21 flows downward inside the supply tube 24. The gas G flowing downward inside the supply tube 24 is supplied to the wafer W mounted on the susceptor 30. The excess gas G of the gas G supplied to the inside of the chamber 20 is discharged to the outside of the chamber 20 through the discharge ports 22.

When the source gas contained in the gas G reacts on the surface of the wafer W, an epitaxial film is formed on the surface of the wafer W. For example, the source gas is a gas containing Si-based gas and C-based gas. For example, the Si-based gas is silane ($SiH_4$), dichlorosilane ($SiH_2Cl_2$), trichlorosilane ($SiHCl_3$), tetrachlorosilane ($SiCl_4$), or the like. For example, the C-based gas is propane ($C_3H_8$) or the like. In the first embodiment, for example, the source gas is a gas containing silane ($SiH_4$) and propane ($C_3H_8$).

In the first embodiment, gases to be used other than the source gas are also supplied to the inside of the chamber 20 through the supply port 21. Examples of the gases to be used include an impurity gas, a carrier gas, and hydrogen chloride (HCl) gas. Examples of the impurity gas include an N-type impurity gas such as nitrogen, and a P-type impurity gas such as trimethylaluminum (TMA). For example, the carrier gas is argon gas or hydrogen gas. More specifically, the carrier gas when the wafer W is carried into the vapor phase growth apparatus 10 and mounted on the susceptor 30, and when the wafer W after film formation is taken out from the susceptor 30 and carried out to the outside of the vapor phase growth apparatus 10 is argon gas. The carrier gas at the time of film formation is hydrogen gas.

The susceptor 30 is a support member supporting the wafer W from below on a support surface 30*a*. The susceptor 30 is supported by the drive unit 60 from below. As shown in FIG. 2, the susceptor 30 has a base portion 31 and a movable portion 32. The base portion 31 and the movable portion 32 are bodies separated from each other. The base portion 31 and the movable portion 32 are made of poly-SiC, for example. The base portion 31 and the movable portion 32 may be made of graphite. In this case, a coating layer constituted using SiC may be provided on each of the surfaces of the base portion 31 and the movable portion 32.

In the first embodiment, the base portion 31 has a ring shape surrounding the rotation axis R. The base portion 31 has the support surface 30*a* supporting the wafer W. The position of the support surface 30*a* on the outermost side in the radial direction is on the radially inward side from the outer circumference of the wafer W. The support surface 30*a* supports the wafer W from below at a position on the radially inward side from the outer circumference of the wafer.

The base portion 31 has an inward ring-shaped portion 33 and a guide support portion 35. As shown in FIG. 3, the inward ring-shaped portion 33 has a ring shape surrounding the rotation axis R. In the first embodiment, a radially inner edge portion of the inward ring-shaped portion 33 is a radially inner edge portion of the base portion 31.

The guide support portion 35 is positioned on the radially outward side from the inward ring-shaped portion 33. In the first embodiment, the guide support portion 35 has a ring shape surrounding the rotation axis R. More specifically, the guide support portion 35 has substantially a toric shape about the rotation axis R. The guide support portion 35 is part supporting the wafer guide portions 40 from below. The guide support portion 35 is disposed on the radially outward side from the support surface 30*a*. An upper surface 36 of the guide support portion 35 is positioned below the support surface 30*a*. The upper surface 36 and the support surface 30*a* are connected in the radial direction by an inclined surface 37. The inclined surface 37 faces downward as it goes radially outward from the radially outward side of the support surface 30*a* and connected to the radially inward side of the upper surface 36.

As shown in FIG. 2, in the first embodiment, a radially inner edge portion of the guide support portion 35 is connected to a radially outer edge portion of the inward ring-shaped portion 33. The upper surface 36 of the guide support portion 35 is positioned above the upward surface of the inward ring-shaped portion 33.

The movable portion 32 is disposed on the radially inward side of the inward ring-shaped portion 33 of the base portion 31. The movable portion 32 is fitted into the radially inward side of the inward ring-shaped portion 33 of the base portion 31. In a state where the wafer W is mounted on the susceptor 30, the rear surface Wb of the wafer W is disposed above away from an upper surface of the inward ring-shaped portion 33 and an upper surface of the movable portion 32. A gap is provided between the wafer W and the inward ring-shaped portion 33 in the vertical direction Z and between the wafer W and the movable portion 32 in the vertical direction Z.

Figure 5:
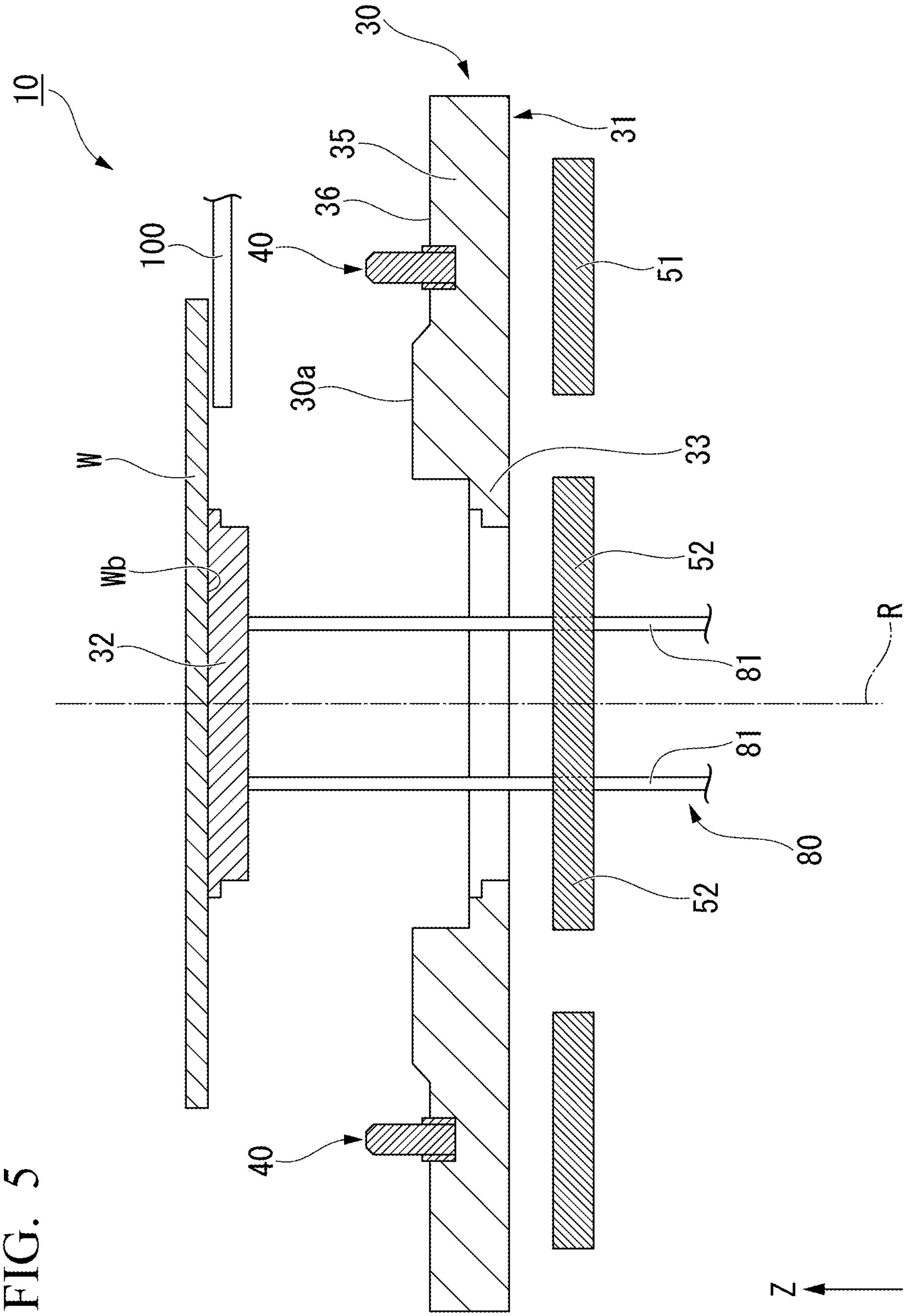
FIG. 5 is a cross-sectional view showing part of the vapor phase growth apparatus of the first embodiment when the wafer is transported.

The movable portion 32 can move in the vertical direction Z. FIG. 5 is a cross-sectional view showing part of the vapor phase growth apparatus 10 when the wafer W is transported. As shown in FIG. 5, when the wafer W is transported, the movable portion 32 is moved upward beyond the inward ring-shaped portion 33. In the first embodiment, the movable portion 32 is moved in the vertical direction Z by an elevation portion 80. The elevation portion 80 has a plurality of movable pins 81 positioned below the movable portion 32. The elevation portion 80 moves the movable portion 32 upward by moving the plurality of movable pins 81 upward such that the plurality of movable pins 81 push up the movable portion 32 upward from below. The plurality of movable pins 81 move upward beyond the second heating portion 52 through the gap provided in the second heating portion 52 and push up the movable portion 32 upward.

When the wafer W is transported onto the susceptor 30, the wafer W transported by a transportation portion 100 is mounted on the movable portion 32 positioned above the inward ring-shaped portion 33. If the movable portion 32 is moved downward by the elevation portion 80 in this state, part of the wafer W on the radially outward side is mounted on the susceptor 30. When the wafer W on the susceptor 30 is transported therefrom, the movable portion 32 moves upward, and the wafer W is lifted upward beyond the wafer guide portions 40 by the movable portion 32. In this state, the wafer W on the movable portion 32 is transported therefrom by the transportation portion 100.

As shown in FIG. 3, the base portion 31 has a plurality of fixing hole portions 35*a* opening upward. The plurality of fixing hole portions 35*a* are disposed with an interval therebetween in the circumferential direction. In the first embodiment, the plurality of fixing hole portions 35*a* are disposed at equal intervals throughout the circumference in the circumferential direction. In the first embodiment, the number of the plurality of fixing hole portions 35*a* is six. In the first embodiment, the fixing hole portions 35*a* are circular holes when viewed in the vertical direction Z. The diameters and the positions in the radial direction of the plurality of fixing hole portions 35*a* are the same. The diameter of an inscribed circle 35*b* of the plurality of fixing hole portions 35*a* about the rotation axis R is larger than the diameter of the wafer W. In the first embodiment, the positions of the plurality of fixing hole portions 35*a* on the radially inward side are parts on the radially outward side from the outer circumference of the wafer W.

Figure 6:
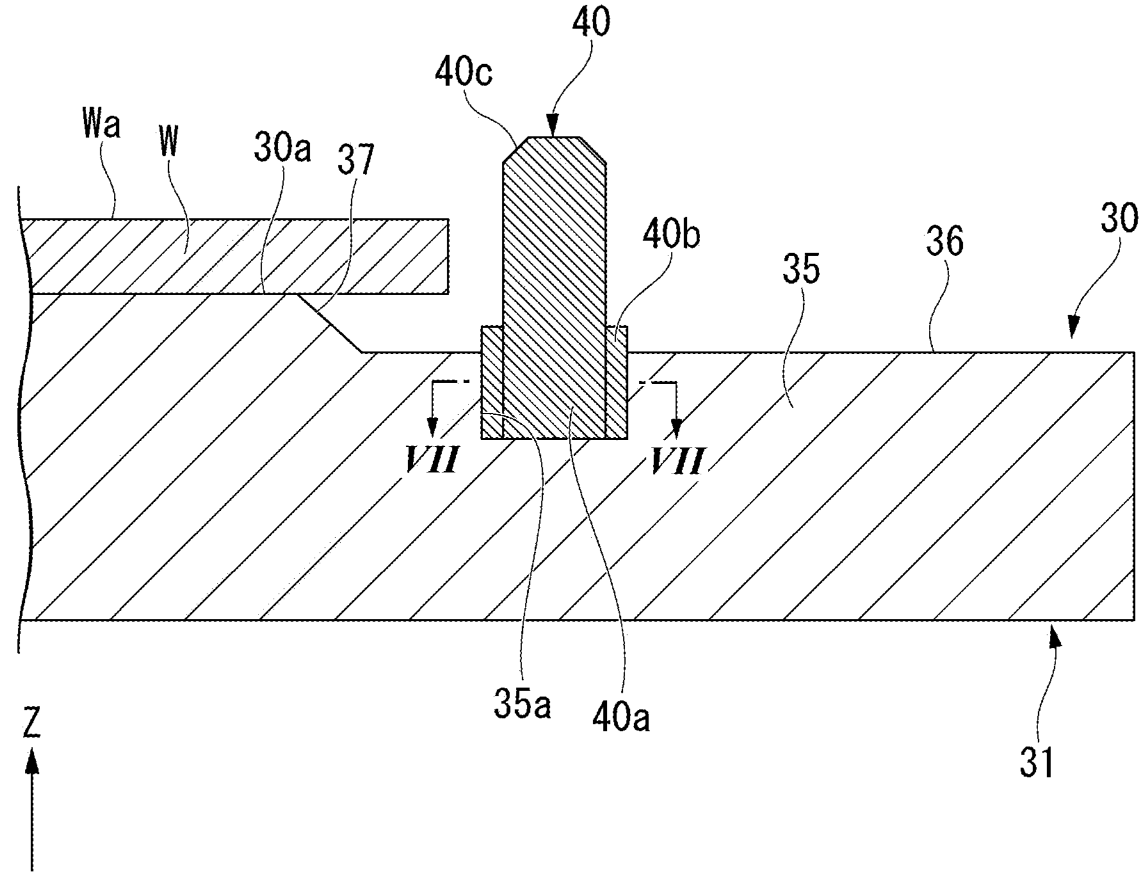
FIG. 6 is a cross-sectional view showing part of a susceptor and part of a wafer guide portion of the first embodiment.

FIG. 6 is a cross-sectional view showing part of the susceptor 30 and part of the wafer guide portion 40. As shown in FIG. 6, the fixing hole portion 35*a* is recessed downward from the upward surface of the guide support portion 35. The fixing hole portion 35*a* is a hole having a bottom portion on the downward side. The fixing hole portion 35*a* may be a hole penetrating the base portion 31 in the vertical direction Z.

The plurality of wafer guide portions 40 are supported by the susceptor 30 from below. The plurality of wafer guide portions 40 surround the outer edge of the wafer W from the radially outward side. The plurality of wafer guide portions 40 are disposed with an interval therebetween in the circumferential direction around the rotation axis R. In the first embodiment, the plurality of wafer guide portions 40 are disposed at equal intervals throughout the circumference in the circumferential direction. The plurality of wafer guide portions 40 may not be disposed at equal intervals. In the first embodiment, the number of the plurality of wafer guide portions 40 is six. The wafer guide portions 40 are made of poly-SiC. The wafer guide portions 40 may be made of graphite. In this case, a coating layer constituted using SiC may be provided on each of the surfaces of the wafer guide portions 40.

As shown in FIG. 6, in the first embodiment, the plurality of wafer guide portions 40 have a pillar shape extending in the vertical direction Z. As shown in FIG. 3, the wafer guide portions 40 have a circular shape when viewed in the vertical direction Z. The plurality of wafer guide portions 40 have a columnar shape extending in the vertical direction Z. The plurality of wafer guide portions 40 are respectively fixed to the insides of the plurality of fixing hole portions 35*a*. In the first embodiment, part of each of the wafer guide portions 40 on the downward side is fixed to the inside of each of the fixing hole portions 35*a*. For example, each of the wafer guide portions 40 is individually fixed to the inside of each of the fixing hole portions 35*a* by press-fitting. The plurality of wafer guide portions 40 respectively protrude upward from the insides of the plurality of fixing hole portions 35*a*. Namely, an end portion of each of the wafer guide portions 40 on the upward side is positioned above an end portion of each of the fixing hole portions 35*a* on the upward side.

One of the plurality of wafer guide portions 40 includes an index. As shown in FIG. 3, in the first embodiment, the wafer guide portion 40 facing the orientation flat portion Wd in the radial direction (which will hereinafter be referred to as a wafer guide portion 40M) has a mark portion M as the index. In the first embodiment, as an example, the mark portion M is a groove provided in a manner of being recessed on the upward surface of the wafer guide portion 40. The direction in which the groove extends is formed parallel to the orientation flat portion Wd. The mark portion M may be a groove or a rib protruding upward from the upward surface of the wafer guide portion 40 and extending parallel to the orientation flat portion Wd.

The mark portion M is part indicating a predetermined direction in which the orientation flat portion Wd provided at the outer edge of the wafer W is aligned when the wafer W is supported by the support surface 30*a*. The predetermined direction is a direction orthogonal to the vertical direction Z. In FIG. 3, the predetermined direction is a lateral direction in FIG. 3 and indicated by an arrow D. In the following description, the predetermined direction indicated by the mark portion M will be referred to as "a predetermined direction D".

Figure 7:
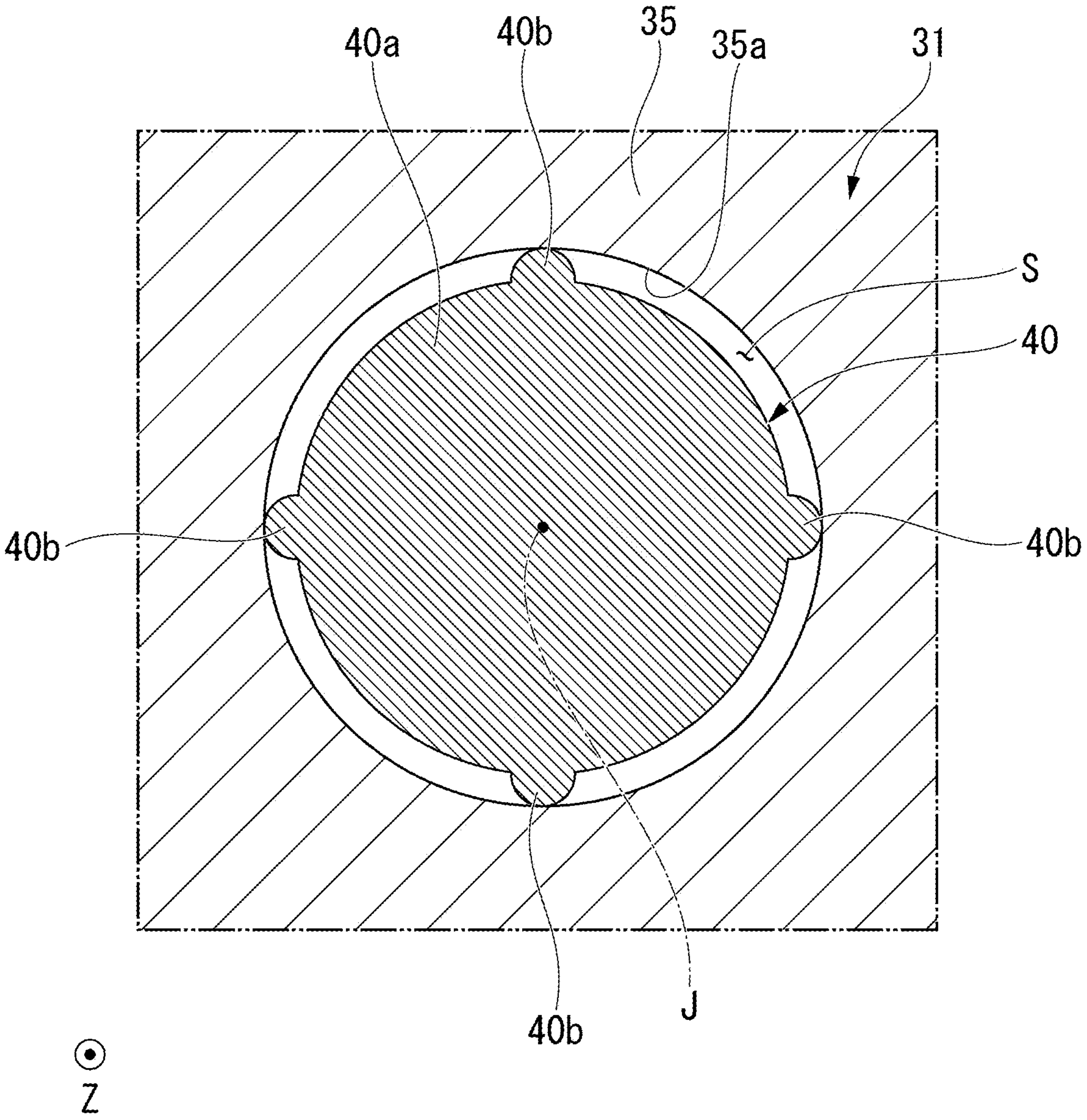
FIG. 7 is a cross-sectional view along VII-VII in FIG. 6.

Each of the plurality of wafer guide portions 40 has a main body portion 40*a* and projection portions 40*b*. The main body portion 40*a* has a pillar shape extending in the vertical direction Z. FIG. 7 is a cross-sectional view showing the wafer guide portion 40 and is a cross-sectional view along VII-VII in FIG. 6. As shown in FIG. 7, in the first embodiment, the main body portion 40*a* has a columnar shape extending in the vertical direction Z about a center axis J. The center axis J is a virtual line extending in the vertical direction Z. The outer diameter of the main body portion 40*a* is smaller than the inner diameter of the fixing hole portion 35*a*. The outer circumferential surface of the main body portion 40*a* is disposed away from the inner surface of the fixing hole portion 35*a*. As shown in FIG. 6, the downward surface of the main body portion 40*a* comes into contact with the bottom surface of the fixing hole portion 35*a*. For example, the downward surface of the main body portion 40*a* is a flat surface orthogonal to the vertical direction Z. For example, the upward surface of the main body portion 40*a* is a flat surface orthogonal to the vertical direction Z.

For example, the upward surface of the main body portion 40*a* may be an arc shape projecting upward in a cross section including the center axis J. In other words, for example, the end portion of the main body portion 40*a* on the upward side may have a hemispherical shape projecting upward. In addition, for example, the end portion of the main body portion 40*a* on the upward side may have a conical shape projecting upward or may have a pyramidal shape projecting upward. It is preferable that the radially inward surface of the main body portion 40*a* on the upward side face downward as it goes toward the radially inward side. In the first embodiment, the upward surface of the main body portion 40*a* is provided with a chamfered portion 40*c* about the center axis J in a portion intersecting the outer circumferential surface of the main body portion 40*a*. The chamfered portion 40*c* facing the radially inward side of the rotation axis R is inclined in a downward direction as it goes toward the radially inward side. Since the chamfered portion 40*c* is provided on the upward side of the main body portion 40*a*, even if the wafer W mounted on the movable portion 32 rides on the main body portion 40*a* when it is transported onto the susceptor 30, the wafer W which has ridden thereon can be smoothly guided to the support surface 30*a* along the chamfered portion 40*c*.

The projection portions 40*b* are provided on the outer circumferential surface of the main body portion 40*a*. The outer circumferential surface of the main body portion 40*a* is a surface on the radially outward side about the center axis J on the entire exposed surface of the main body portion 40*a*. In the following description, the radial direction about the center axis J may be referred to as "a second radial direction". The projection portions 40*b* protrude outward in the second radial direction from the outer circumferential surface of the main body portion 40*a*. As shown in FIG. 7, in the first embodiment, the outward surfaces of the projection portions 40*b* in the second radial direction have an arc shape projecting outward in the second radial direction in a cross section orthogonal to the vertical direction Z. In the first embodiment, the projection portions 40*b* have a semicircular shape projecting outward in the second radial direction in a cross section orthogonal to the vertical direction Z. As shown in FIG. 6, in the first embodiment, the projection portions 40*b* are ribs extending in the vertical direction Z. The end portions of the projection portions 40*b* on the upward side are positioned below the end portion of the main body portion 40*a* on the upward side. The end portions of the projection portions 40*b* on the downward side are flush with the end portion of the main body portion 40*a* on the downward side. Parts of the projection portions 40*b* on the downward side are positioned inside the fixing hole portions 35*a*. Parts of the projection portions 40*b* on the upward side are positioned above the fixing hole portions 35*a*.

As shown in FIG. 7, the projection portions 40*b* come into contact with the inner surfaces (inner circumferential surfaces) of the fixing hole portions 35*a* facing the outer circumferential surface of the main body portion 40*a* in the parts positioned inside the fixing hole portions 35*a*. More specifically, the end portions of the projection portions 40*b* on the outward side in the second radial direction in the parts positioned inside the fixing hole portions 35*a* come into contact with the inner surfaces of the fixing hole portions 35*a*. The plurality of projection portions 40*b* are provided with an interval therebetween in the circumferential direction around the center axis J. The plurality of projection portions 40*b* are disposed at equal intervals throughout the circumference in the circumferential direction around the center axis J. In the first embodiment, the number of the plurality of projection portions 40*b* is four. In the first embodiment, the plurality of projection portions 40*b* are deformed in the second radial direction when the wafer guide portions 40 are press-fitted into the fixing hole portions 35*a*. For example, the plurality of projection portions 40*b* are in a state of being elastically deformed in the second radial direction inside the fixing hole portions 35*a*.

In each of the plurality of wafer guide portions 40, at least part on the outer circumferential surface in part of the wafer guide portion 40 positioned inside the fixing hole portion 35*a* is disposed away from the inner surface of the fixing hole portion 35*a*. The outer circumferential surface in the part of the wafer guide portion 40 positioned inside the fixing hole portion 35*a* includes the outer circumferential surface in the part of the main body portion 40*a* positioned inside the fixing hole portion 35*a*, and the outward surface in the second radial direction in the part of each of the plurality of projection portions 40*b* positioned inside the fixing hole portion 35*a*. In the first embodiment, the end portion of each of the plurality of projection portions 40*b* on the outward side in the second radial direction comes into contact with the inner surface of the fixing hole portion 35*a*. The parts other than the end portions of the plurality of projection portions 40*b* on the outward side in the second radial direction in the part of the wafer guide portion 40 positioned inside the fixing hole portion 35*a* is disposed on the inward side in the second radial direction away from the inner surfaces of the fixing hole portions 35*a*. For this reason, a gap S is provided between the outer circumferential surface of the wafer guide portion 40 and the inner surface of the fixing hole portion 35*a*. In the first embodiment, the gap S is a void filled with gas.

Figure 8:
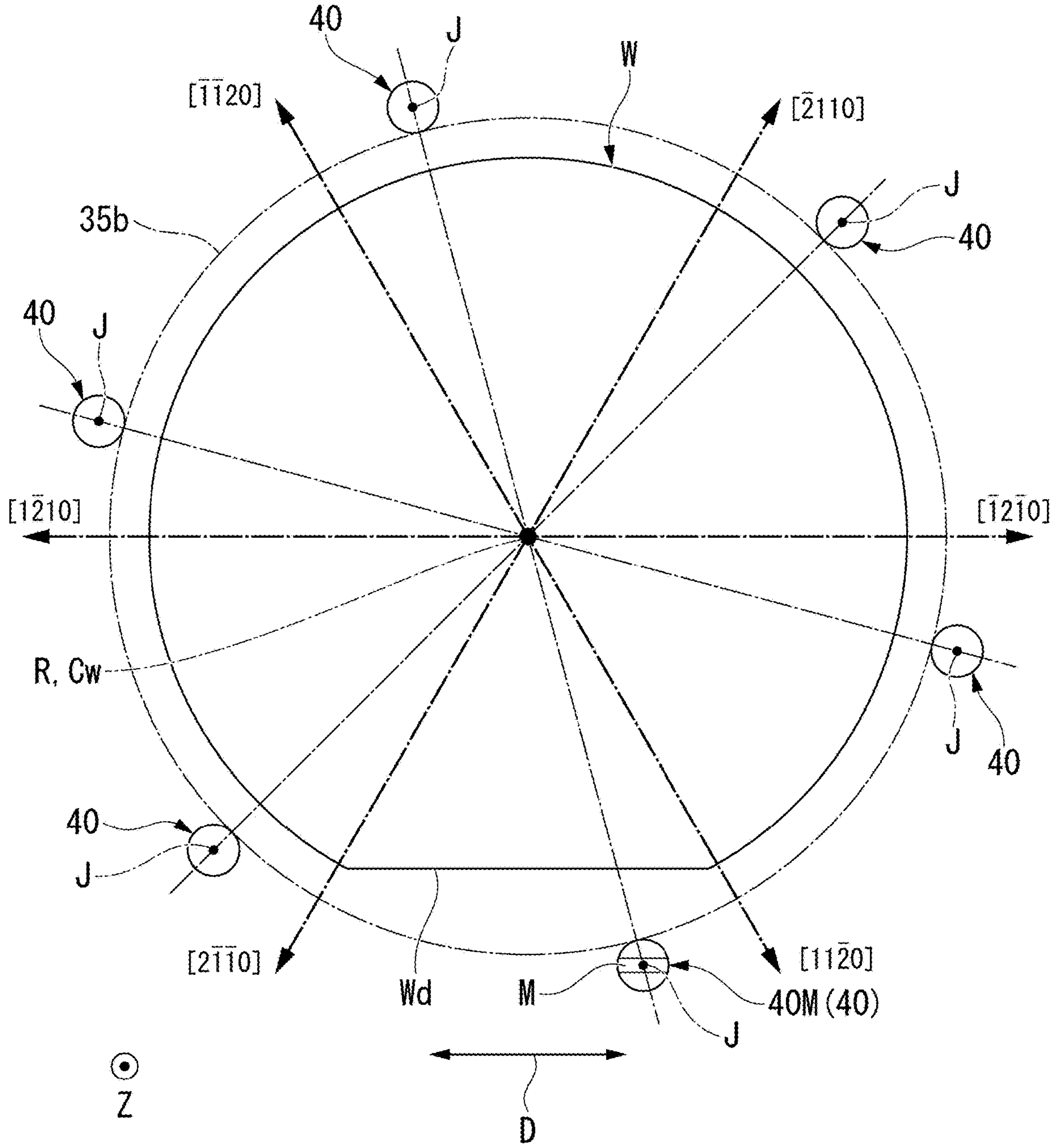
FIG. 8 is a view showing a disposition relationship between crystal orientations in the wafer and a plurality of wafer guide portions of the first embodiment.

FIG. 8 is a view of the wafer W viewed from above in a state of being surrounded by the plurality of wafer guide portions 40 and is a view showing a disposition relationship between the crystal orientation of the wafer W and the plurality of wafer guide portions 40. FIG. 8 shows the crystal orientation of the wafer W represented by <11−20> with the arrow of a one-dot dashed line. As shown in FIG. 8, each direction in which the rotation axis R and each of the wafer guide portions 40 are connected when viewed in the vertical direction Z is different from the crystal orientation of the wafer W represented by <11−20>. Namely, each direction in which the rotation axis R and each of the wafer guide portions 40 are connected when viewed in the vertical direction Z is different from the cleavage direction in the wafer W.

In FIG. 8, the direction in which the rotation axis R and each of the wafer guide portions 40 are connected is indicated by a one-dot dashed line passing through the rotation axis R and the center axis J of each of the wafer guide portions 40 when viewed in the vertical direction Z. It is preferable that the direction in which the rotation axis R and each of the wafer guide portions 40 are connected be a direction offset with respect to the cleavage direction in the wafer W by 5° or greater. It is more preferable that the direction in which the rotation axis R and each of the wafer guide portions 40 are connected be a direction offset with respect to the cleavage direction in the wafer W by 10° or greater. It is further preferable that the direction in which the rotation axis R and each of the wafer guide portions 40 are connected be a direction offset with respect to the cleavage direction in the wafer W by 15° or greater.

In this specification, the expression "a certain direction is different from other directions" means that a certain direction is not parallel to other directions. Namely, the expression "the direction in which the rotation axis R and the wafer guide portion 40 are connected is different from the cleavage direction in the wafer W" means that the direction in which the rotation axis R and the wafer guide portion 40 are connected is not parallel to the cleavage direction in the wafer W.

The direction in which the rotation axis R and each of the wafer guide portions 40 are connected when viewed in the vertical direction Z is different from the predetermined direction D indicated by the mark portion M. The direction in which the rotation axis R and each of the wafer guide portions 40 are connected when viewed in the vertical direction Z is different from the direction inclined with respect to the predetermined direction D by 60°. In FIG. 8, the predetermined direction D is crystal orientations represented by [−12−10] and [1−210]. The direction inclined with respect to the predetermined direction D by 60° is crystal orientations represented by [−2110], [−1−120], [2−1−10], and [11−20].

Figure 9:
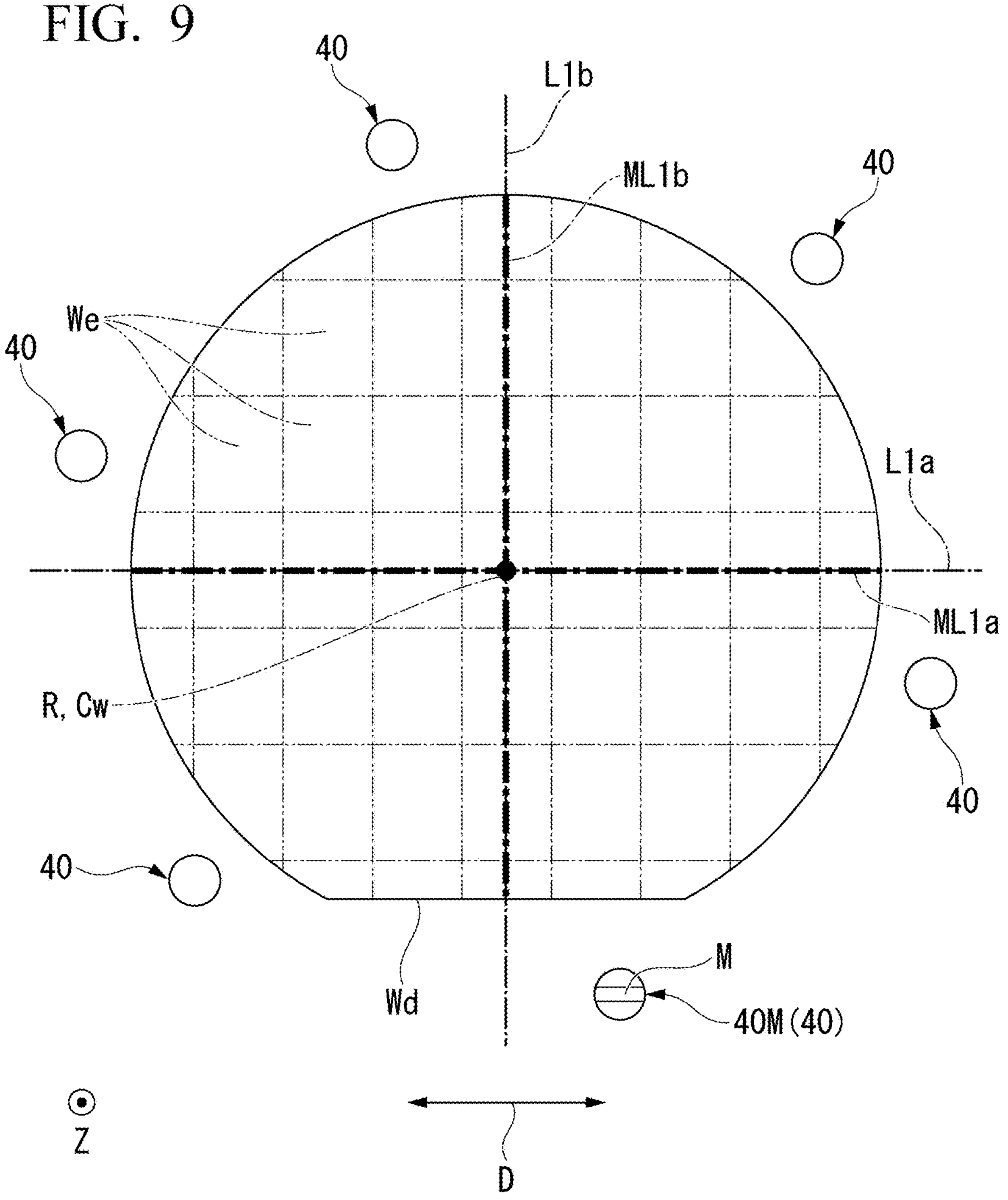
FIG. 9 is a view showing a disposition relationship between measurement spots in the wafer after film formation and the plurality of wafer guide portions of the first embodiment.

FIG. 9 is a view of the wafer W in a state of being supported by the plurality of wafer guide portions 40 viewed from above and is a view showing a disposition relationship between measurement spots in the wafer W after film formation and the plurality of wafer guide portions 40. Straight lines L1*a* and L1*b* indicated in FIG. 9 are virtual lines extending in a direction orthogonal to the vertical direction Z. The straight line L1*a* is a straight line passing through the rotation axis R and extending in the predetermined direction D indicated by the mark portion M when viewed in the vertical direction Z. The straight line L1*b* is a straight line passing through the rotation axis R and extending in a direction orthogonal to the predetermined direction D when viewed in the vertical direction Z. The plurality of wafer guide portions 40 are disposed at positions different from those on the straight line L1*a* passing through the rotation axis R and extending in the predetermined direction D when viewed in the vertical direction Z. The plurality of wafer guide portions 40 are disposed at positions different from those on the straight line L1*b* passing through the rotation axis R and extending in a direction orthogonal to the predetermined direction D when viewed in the vertical direction Z. When viewed in the vertical direction Z, for example, it is preferable that the plurality of wafer guide portions 40 be disposed away from the straight lines L1*a* and L1*b* at a distance of 5 mm or more, and it is further preferable that they be disposed away therefrom at a shortest distance of 10 mm or more.

As shown in FIG. 1, the drive unit 60 rotates the susceptor 30 around the rotation axis R extending in the vertical direction Z. The drive unit 60 has a susceptor holding portion 61 and a power unit 62. The susceptor holding portion 61 has a tubular shape opening upward. The susceptor 30 is held by the end portion of the susceptor holding portion 61 on the upward side. The susceptor holding portion 61 is positioned inside the chamber 20. The susceptor holding portion 61 constitutes the wafer support structure 70. The end portion of the susceptor holding portion 61 on the downward side is positioned outside the chamber 20 through the hole formed in the bottom portion of the chamber 20. The power unit 62 rotates the susceptor holding portion 61 around the rotation axis R. For example, the power unit 62 is a motor. The power unit 62 is connected to the end portion of the susceptor holding portion 61 on the downward side. The power unit 62 may have a motor and a deceleration mechanism connected to the motor. In this case, rotation of the motor is transmitted to the susceptor holding portion 61 via the deceleration mechanism. For example, the power unit 62 is positioned outside the chamber 20.

The first heating portions 51 and the second heating portion 52 are heating portions capable of heating the susceptor 30. When the susceptor 30 is heated by the first heating portions 51 and the second heating portion 52, the wafer W and the wafer guide portions 40 which come into contact with the susceptor 30 are heated. As shown in FIG. 2, in the first embodiment, the first heating portions 51 and the second heating portion 52 are positioned below the susceptor 30. The first heating portions 51 and the second heating portion 52 heat the susceptor 30 by applying heat H to the susceptor 30 from below. The first heating portions 51 and the second heating portion 52 are positioned inside the susceptor holding portion 61 in the drive unit 60. The first heating portions 51 and the second heating portion 52 are resistance heating-type heaters. For example, the first heating portions 51 and the second heating portion 52 are constituted of heating wires extending along a plane orthogonal to the vertical direction Z. The first heating portions 51 and the second heating portion 52 may have any structure as long as they are capable of heating a target.

The first heating portions 51 are positioned on the radially outward side from the second heating portion 52. The first heating portions 51 surround the second heating portion 52 from the radially outward side. The first heating portions 51 are positioned below the wafer guide portions 40 and the guide support portion 35. At least part of each of the first heating portions 51 overlaps each of the wafer guide portions 40 when viewed in the vertical direction Z.

The second heating portion 52 is positioned on the radially inward side away from the first heating portions 51. The second heating portion 52 has a part positioned below the inward ring-shaped portion 33 and a part positioned below the movable portion 32. The radially outer edge portion of the second heating portion 52 is positioned below the inward ring-shaped portion 33. In the second heating portion 52, the part positioned on the radially inward side from the part positioned below the inward ring-shaped portion 33 is positioned below the movable portion 32.

As shown in FIG. 1, the third heating portions 53 have a ring shape surrounding the supply tube 24. In the first embodiment, the vapor phase growth apparatus 10 includes three third heating portions 53. The three third heating portions 53 are disposed with an interval therebetween in the vertical direction Z. Each of the third heating portions 53 heats the gas G passing through the inside of the supply tube 24.

Accordingly, the temperature of the gas G when it arrives at the wafer W can be increased. Therefore, the film formation speed of the SiC film formed on the surface of the wafer W can be increased. The number of third heating portions 53 provided in the vapor phase growth apparatus 10 may be two or less or may be four or more. For example, the third heating portions 53 are resistance heating-type heaters constituted of heating wires. The third heating portions 53 may have any structure as long as they are capable of heating a target.

Figure 10:
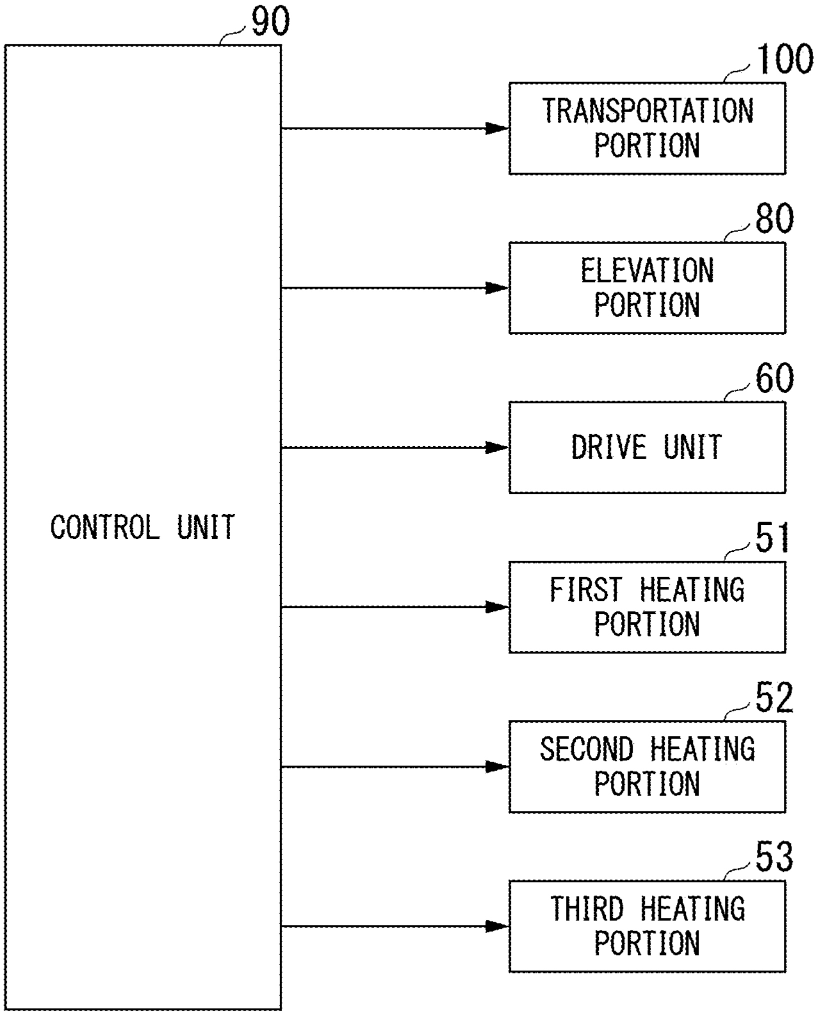
FIG. 10 is a block diagram showing part of the vapor phase growth apparatus of the first embodiment.

FIG. 10 is a block diagram showing part of the vapor phase growth apparatus 10. As shown in FIG. 10, the vapor phase growth apparatus 10 includes a control unit 90. The control unit 90 controls each portion of the vapor phase growth apparatus 10. The control unit 90 controls the first heating portions 51, the second heating portion 52, the third heating portions 53, the drive unit 60, the elevation portion 80, and the transportation portion 100.

Figure 11:
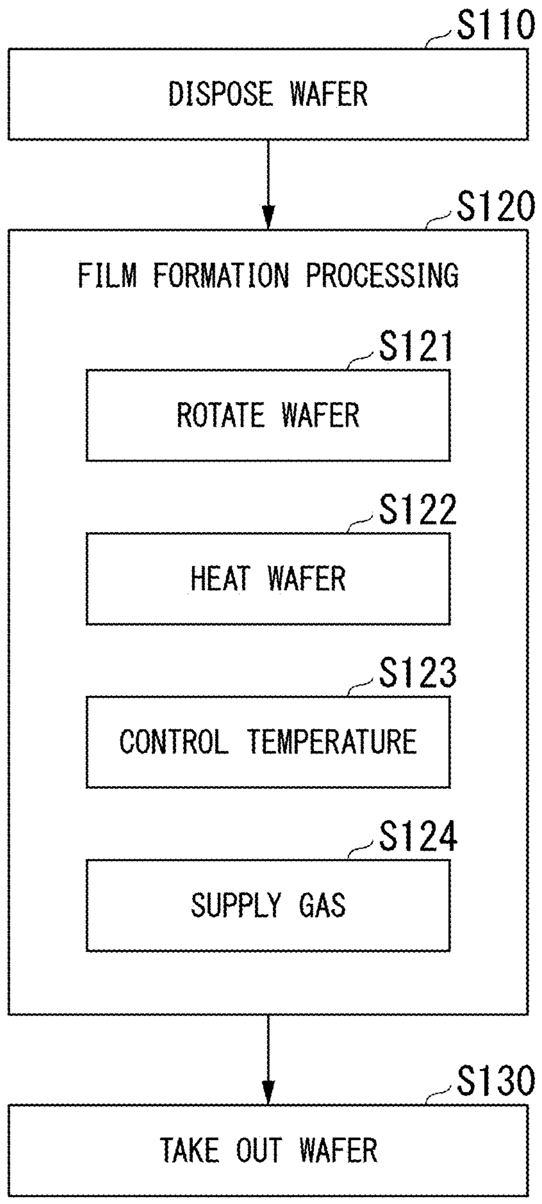
FIG. 11 is a flowchart showing an example of a procedure of a film formation method for forming a film on a surface of a wafer using the vapor phase growth apparatus of the first embodiment.

FIG. 11 is a flowchart showing an example of a procedure of a film formation method for forming a film on a surface of the wafer W using the vapor phase growth apparatus 10. As shown in FIG. 11, the control unit 90 causes the wafer W to be disposed on the susceptor 30 (Step S110). In Step S110, the control unit 90 causes the transportation portion 100 to transport the wafer W such that the wafer W is mounted on the movable portion 32 in a state of having moved upward as shown in FIG. 5. The control unit 90 controls the elevation portion 80 to move the movable portion 32 downward such that the wafer W on the movable portion 32 is mounted on the support surface 30*a*. Accordingly, the wafer W is mounted on the susceptor 30. Even if the wafer W rides on the wafer guide portions 40 when the wafer W is mounted on the support surface 30*a*, the wafer W which has ridden thereon can be smoothly guided to the support surface 30*a* along the chamfered portion 40*c* of the main body portion 40*a*.

In Step S110, the control unit 90 detects the orientation flat portion Wd of the wafer W using the transportation portion 100 and causes the wafer W to be mounted on the movable portion 32 such that the extending direction of the orientation flat portion Wd is aligned in the predetermined direction D indicated by the direction in which the groove of the mark portion M of the wafer guide portion 40 extends. In particular, in the film formation method of the first embodiment, film formation processing includes aligning the orientation flat portion Wd in the predetermined direction D. Accordingly, the plurality of wafer guide portions 40 and the wafer W surrounded by the plurality of wafer guide portions 40 have the disposition relationship shown in FIGS. 3, 8, and 9. Therefore, the direction in which the rotation axis R and each of the wafer guide portions 40 are connected when viewed in the vertical direction Z becomes a direction different from the cleavage direction in the wafer W, that is, the crystal orientation of the wafer W represented by <11−20>.

As shown in FIG. 11, after the wafer W is mounted on the susceptor 30, the control unit 90 executes the film formation processing of forming a film on the surface of the wafer W (Step S120). In particular, the film formation method according to the first embodiment includes the film formation processing of forming a film on the surface of the wafer W. The film formation processing is performed in a state where the wafer W is surrounded by the plurality of wafer guide portions 40 while maintaining the disposition relationship at the time when the wafer W has been disposed in Step S110. In particular, in the film formation method of the first embodiment, the film formation processing includes surrounding the wafer W with the plurality of wafer guide portions 40 such that each direction in which the rotation axis R and each of the wafer guide portions 40 are connected when viewed in the vertical direction Z becomes different from the cleavage direction in the wafer W. The film formation processing includes surrounding the wafer W with the plurality of wafer guide portions 40 such that each direction in which the rotation axis R and each of the wafer guide portions 40 are connected when viewed in the vertical direction Z becomes different from the crystal orientation of the wafer W represented by <11−20>.

During the film formation processing, the control unit 90 causes the wafer W to rotate around the rotation axis R (Step S121) and causes the wafer W to be heated (Step S122). During the film formation processing, the control unit 90 causes the wafer W to be rotated around the rotation axis R by causing the drive unit 60 to rotate the susceptor 30 around the rotation axis R. During the film formation processing, the control unit 90 causes the wafer W to be heated by causing the first heating portions 51 and the second heating portion 52 to heat the susceptor 30. Rotating the wafer W and heating the wafer W are performed until the film formation processing ends.

During the film formation processing, the control unit 90 controls the temperature of the wafer W (Step S123). In Step S123, the control unit 90 measures the temperature of the wafer W using a temperature sensor (not shown). In Step S123, the control unit 90 controls the first heating portions 51 and the second heating portion 52 on the basis of measurement results of the temperature sensor (not shown). The control unit 90 controls the first heating portions 51 and the second heating portion 52 such that the temperature of the wafer W measured by the temperature sensor (not shown) becomes 1,500° C. to 1,650° C., for example.

During the film formation processing, the control unit 90 causes the gas G containing the source gas to flow into the chamber 20 through the supply port 21, thereby supplying the gas G to the wafer W (Step S124). The SiC film is formed on the surface Wa of the wafer W by supplying the source gas to the heated surface Wa of the wafer W. The SiC film having a desired thickness is formed on the surface Wa of the wafer W by continuously supplying the source gas to the wafer W for a predetermined time. The supply amount of the source gas and variation in the source gas within the surface Wa of the wafer W can be reduced by supplying the source gas to the surface Wa of the wafer W while the wafer W is rotated around the rotation axis R by the drive unit 60. Therefore, the uniformity of the thickness of the film formed on the wafer W can be enhanced. During the film formation processing, the control unit 90 causes the third heating portions 53 to heat the gas G inside the supply tube 24. If the film formation processing ends, the control unit 90 stops the drive unit 60 and each of the heating portions and stops supply of the gas G to the inside of the chamber 20.

Step S123 described above, in which the temperature of the wafer W is controlled, is continuously executed at all times during the film formation processing, for example. Step S123 may be performed at predetermined time intervals. Step S121, in which the wafer W is rotated, may be started before the gas G is supplied and after the wafer W is heated to a predetermined temperature.

After the film formation processing ends, the control unit 90 causes the wafer W to be taken out from the vapor phase growth apparatus 10 (Step S130). In Step S130, the control unit 90 causes the elevation portion 80 to move the movable portion 32 upward such that the wafer W is lifted up. The control unit 90 causes the transportation portion 100 to transport the lifted wafer W.

According to the first embodiment, the vapor phase growth apparatus 10 used in the film formation method includes the susceptor 30 supporting the wafer W, and a plurality of wafer guide portions 40 surrounding the wafer W. The wafer guide portions 40 are disposed with an interval therebetween in the circumferential direction around the rotation axis R and protrude upward beyond the susceptor 30. In this manner, since the plurality of wafer guide portions 40 are disposed with an interval therebetween in the circumferential direction, the supplied source gas can flow from the surface Wa of the wafer W between the wafer guide portions 40 away from each other in the circumferential direction. For this reason, compared to when the wafer guide portions 40 have a ring shape, a hindrance to a flow of the source gas can be curbed. Accordingly, it is possible to curb a situation in which the film thickness and the carrier concentration of the film formed in the parts of the wafer W on the outer circumferential side significantly differ from the film thickness and the carrier concentration of the film formed in the parts of the wafer W on the center side and film formation characteristics deteriorate.

According to the first embodiment, each direction in which the rotation axis R and each of the wafer guide portions 40 are connected when viewed in the vertical direction Z is different from the cleavage direction in the wafer W. In other words, the film formation processing in the film formation method for forming a film on the surface of the wafer W using the vapor phase growth apparatus 10 includes surrounding the wafer W with the plurality of wafer guide portions 40 such that each direction in which the rotation axis R and each of the wafer guide portions 40 are connected when viewed in the vertical direction Z becomes different from the cleavage direction in the wafer W. For this reason, since the wafer W is rotated, the wafer W comes into contact with the wafer guide portions 40 when it is offset radially outward such that the wafer W is prevented from being offset from a desired position in the susceptor. At this time, if the lines connecting the rotation axis R and the wafer guide portions 40 are in the same direction as the cleavage directions, cleavage is likely to occur. In order to prevent this, a direction in which stress generated in the wafer W due to contact with each of the wafer guide portions 40 acts can be offset with respect to the cleavage directions in which the wafer W is likely to break by disposing the wafer guide portions 40 such that both directions do not coincide with each other. Accordingly, during the film formation processing, it is possible to curb breakage of the wafer W surrounded by the plurality of wafer guide portions 40 and occurrence of crystal defects, that is, dislocation of the wafer W due to stress. An effect of curbing breakage of the wafer W can be obtained preferably when the offset angle of the direction, in which the rotation axis R and each of the wafer guide portions 40 are connected when viewed in the vertical direction Z, with respect to the cleavage direction in the wafer W is 5° or greater, can be obtained more preferably when it is 10° or greater, and can be obtained even more preferably when it is 15° or greater. The effect of curbing breakage of the wafer W can be obtained as long as the offset angle of the direction, in which the rotation axis R and each of the wafer guide portions 40 are connected when viewed in the vertical direction Z, with respect to the cleavage direction in the wafer W is greater than 0°.

According to the first embodiment, the wafer W is formed of single crystal having a hexagonal crystal structure. Each direction in which the rotation axis R and each of the wafer guide portions 40 are connected when viewed in the vertical direction Z is different from the crystal orientation of the wafer W represented by <11−20>. In other words, the film formation processing includes surrounding the wafer W with the plurality of wafer guide portions 40 such that each direction in which the rotation axis R and each of the wafer guide portions 40 are connected when viewed in the vertical direction Z becomes different from the crystal orientation of the wafer W represented by <11−20>. For this reason, the direction in which stress generated in the wafer W due to contact with each of the wafer guide portions 40 can be caused to differ from the cleavage direction in the wafer W formed of single crystal having a hexagonal crystal structure. Accordingly, breakage of the wafer W formed of single crystal having a hexagonal crystal structure can be curbed.

According to the first embodiment, the wafer guide portion 40M includes the mark portion M that is an index indicating the predetermined direction D orthogonal to the vertical direction Z. The direction in which the rotation axis R and each of the wafer guide portions 40 are connected when viewed in the vertical direction Z is different from the predetermined direction D and is also different from the direction inclined with respect to the predetermined direction D by 60°. The wafer W is a SiC substrate. The plate surface of the wafer W is a surface aligned with the crystal plane represented by (0001). The outer edge of the wafer W is provided with the orientation flat portion Wd extending in the crystal orientation of the wafer W represented by <11–20>. The film formation processing includes aligning the orientation flat portion Wd with the predetermined direction D. Therefore, as shown in FIG. 8, the cleavage directions in the wafer W become directions inclined by 60° with respect to the extending direction of the orientation flat portion Wd and the extending direction of the orientation flat portion Wd. For this reason, each of the wafer guide portions 40 is disposed such that the direction in which the rotation axis R and each of the wafer guide portions 40 are connected when viewed in the vertical direction Z differs from any of the predetermined direction D indicated by the mark portion M and the direction inclined with respect to the predetermined direction D by 60°, and the wafer W is surrounded by the plurality of wafer guide portions 40 by aligning the orientation flat portion Wd with the predetermined direction D. Accordingly, the direction in which the rotation axis R and each of the wafer guide portions 40 are connected when viewed in the vertical direction Z can become different from the cleavage direction in the wafer W having a hexagonal crystal structure. Therefore, it is possible to curb breakage of the wafer W formed of single crystal having a hexagonal crystal structure during the film formation processing.

For example, when the thickness, the carrier concentration, and the like of the film formed on the surface of the wafer W are measured in order to check the quality of the wafer W, the thickness, the carrier concentration, and the like of the film are measured at a plurality of spots on a straight line passing through a center Cw of the wafer W having substantially a disk shape and extending in a direction orthogonal to the plate thickness direction of the wafer W. For example, the directions in which measurement is performed are determined on the basis of directions in which a plurality of semiconductor elements formed on the wafer W are arranged. As indicated by the two-dot dashed line in FIG. 9, in the wafer W provided with the orientation flat portion Wd, the semiconductor elements are respectively formed in a plurality of element formation regions We arranged in a matrix shape in the extending direction of the orientation flat portion Wd and the direction orthogonal to the extending direction of the orientation flat portion Wd. For this reason, in many cases, measurement of a film is performed at spots on the wafer W positioned on measurement lines ML1*a* and ML1*b* respectively extending in two directions in which the plurality of element formation regions We are arranged. The measurement line ML1*a* is a straight line passing through the center Cw of the wafer W and extending in the extending direction of the orientation flat portion Wd when viewed in the plate thickness direction of the wafer W. The measurement line ML1*b* is a straight line passing through the center Cw of the wafer W and extending in a direction orthogonal to the extending direction of the orientation flat portion Wd when viewed in the plate thickness direction of the wafer W. During the film formation processing, at the spots in the wafer W which have come into contact with the plurality of wafer guide portions 40, the temperature is more likely to rise than those in other parts of the wafer W. For this reason, at the spots in the wafer W which have come into contact with the plurality of wafer guide portions 40, the film thickness and the carrier concentration are likely to be offset from the average values. Therefore, the spots in the wafer W which have come into contact with the plurality of wafer guide portions 40 may not be used in manufacturing a semiconductor device. It may not be preferable to perform measurement of a film with respect to such parts in the wafer W not used in manufacturing a semiconductor device.

In such a case described above, according to the first embodiment, when viewed in the vertical direction Z, the plurality of wafer guide portions 40 are disposed at positions different from those on the straight line L1*a* passing through the rotation axis R and extending in the predetermined direction D and disposed at positions different from those on the straight line L1*b* passing through the rotation axis R and extending in a direction orthogonal to the predetermined direction D. When the center Cw of the wafer W is caused to coincide with the rotation axis R and when viewed in the vertical direction Z, the straight lines L1*a* and L1*b* respectively coincide with the measurement lines ML1*a* and ML1*b* during measurement of a film of the wafer W. Namely, when viewed in the vertical direction Z, the straight line L1*a* coincides with the measurement line ML1*a* passing through the center Cw of the wafer W and extending in the extending direction of the orientation flat portion Wd. When viewed in the vertical direction Z, the straight line L1*b* coincides with the measurement line ML1*b* passing through the center Cw of the wafer W and extending in a direction orthogonal to the extending direction of the orientation flat portion Wd. Since the plurality of wafer guide portions 40 are disposed at positions different from those on the straight lines L1*a* and L1*b* when viewed in the vertical direction Z, in the wafer W during the film formation processing, the spots different from the measurement spots on the measurement lines ML1*a* and ML1*b* to be measured after film formation are surrounded by the plurality of wafer guide portions 40. Accordingly, measurement of the film thickness and the carrier concentration of the parts in the wafer W surrounded by the plurality of wafer guide portions 40 during the film formation processing is curbed.

An effect of curbing measurement of the film thickness and the carrier concentration of the parts in the wafer W away from the parts surrounded by the plurality of wafer guide portions 40 during the film formation processing can be obtained preferably when the plurality of wafer guide portions 40 are disposed away from the straight lines L1*a* and L1*b* by 5 mm or longer when viewed in the vertical direction Z, and can be obtained more preferably when they are disposed away from the straight lines L1*a* and L1*b* by 10 mm or longer.

According to the first embodiment, the susceptor 30 includes the base portion 31. The base portion 31 has the plurality of fixing hole portions 35*a* opening upward and disposed with an interval therebetween in the circumferential direction. The plurality of wafer guide portions 40 are respectively fixed to the insides of the plurality of fixing hole portions 35*a* and respectively protrude upward from the insides of the plurality of fixing hole portions 35*a*. For this reason, compared to when the base portion 31 and the plurality of wafer guide portions 40 are integrally molded, heat can be made less likely to be transmitted from the base portion 31 to each of the wafer guide portions 40. Therefore, it is possible to curb an increase in temperature in the parts which have come into contact with each of the wafer guide portions 40 in the parts of the wafer W on the outer circumferential side. For this reason, it is possible to further curb increase in temperature at the parts of the wafer W on the outer circumferential side during the film formation processing than that in the central portion of the wafer W.

Therefore, it is possible to further curb a situation in which the film thickness and the carrier concentration of the film formed in the parts of the wafer W on the outer circumferential side significantly differ from the film thickness and the carrier concentration of the film formed in the parts of the wafer W on the center side. For this reason, it is possible to further curb deterioration in film formation characteristics such as the wafer surface distribution of a film formed on the wafer W in the parts of the wafer W on the outer circumferential side. Accordingly, it is possible to further reduce parts which cannot be used as regions in which semiconductor elements are formed in the wafer W after film formation. Therefore, it is possible to further curb decrease in yield of a semiconductor device manufactured using the wafer W.

According to the first embodiment, in each of the plurality of wafer guide portions 40, at least part of each of the wafer guide portions 40 on the outer circumferential surface of the part positioned inside the fixing hole portion 35*a* is disposed away from the inner surfaces of the fixing hole portions 35*a*. For this reason, compared to when the outer circumferential surface of each of the wafer guide portions 40 entirely comes into contact with the inner surface of each of the fixing hole portions 35*a*, heat can be made less likely to be transmitted from the base portion 31 to each of the wafer guide portions 40. Therefore, it is possible to further curb increase in temperature at the parts of the wafer W which have come into contact with the plurality of wafer guide portions 40.

According to the first embodiment, each of the plurality of wafer guide portions 40 has the main body portion 40*a* extending in the vertical direction Z, and the projection portions 40*b* provided on the outer circumferential surface of the main body portion 40*a*. The projection portions 40*b* come into contact with the inner surfaces of the fixing hole portions 35*a*. For this reason, while the wafer guide portions 40 are fixed to the insides of the fixing hole portions 35*a* via the projection portions 40*b*, part of each of the outer circumferential surfaces of the wafer guide portions 40 can be separated from each of the inner surfaces of the fixing hole portions 35*a*.

According to the first embodiment, the susceptor 30 has the guide support portion 35 supporting the plurality of wafer guide portions 40 from below on the radially outward side about the rotation axis R from the support surface 30*a* supporting the wafer W. The guide support portion 35 is positioned below the support surface 30*a*. For this reason, foreign matter which has fallen down due to contact or the like between the wafer W and the wafer guide portions 40 is accumulated in the guide support portion 35 below the support surface 30*a*. Therefore, it is possible to curb deterioration in flatness adversely affecting the film formation characteristics caused when fallen foreign matter is accumulated on the support surface 30*a* and the wafer W transported to the support surface 30*a* pinches the foreign matter.

Hereinafter, other embodiments different from the foregoing embodiment will be described. In description of each of the following embodiments, the same reference signs are suitably applied or the like to constitutions similar to the constitutions described in the foregoing embodiment, and description may be omitted. Regarding the constitutions whose description is omitted in each of the following embodiments, constitutions similar to the constitutions described above in each of the embodiments can be employed within a range with no contradiction.

Second Embodiment

Figure 12:
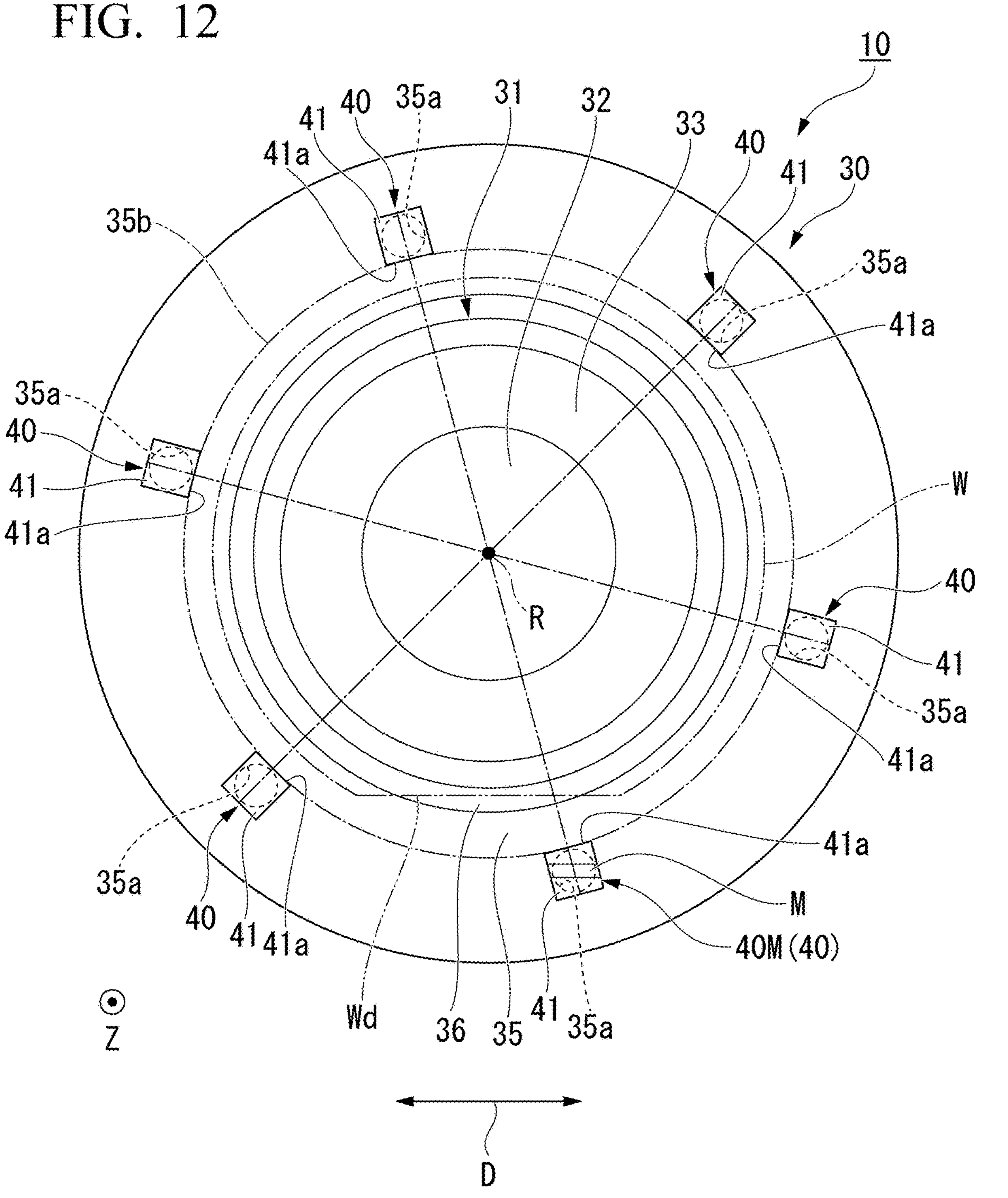
FIG. 12 is a view of the susceptor according to a second embodiment viewed from above.
Figure 13:
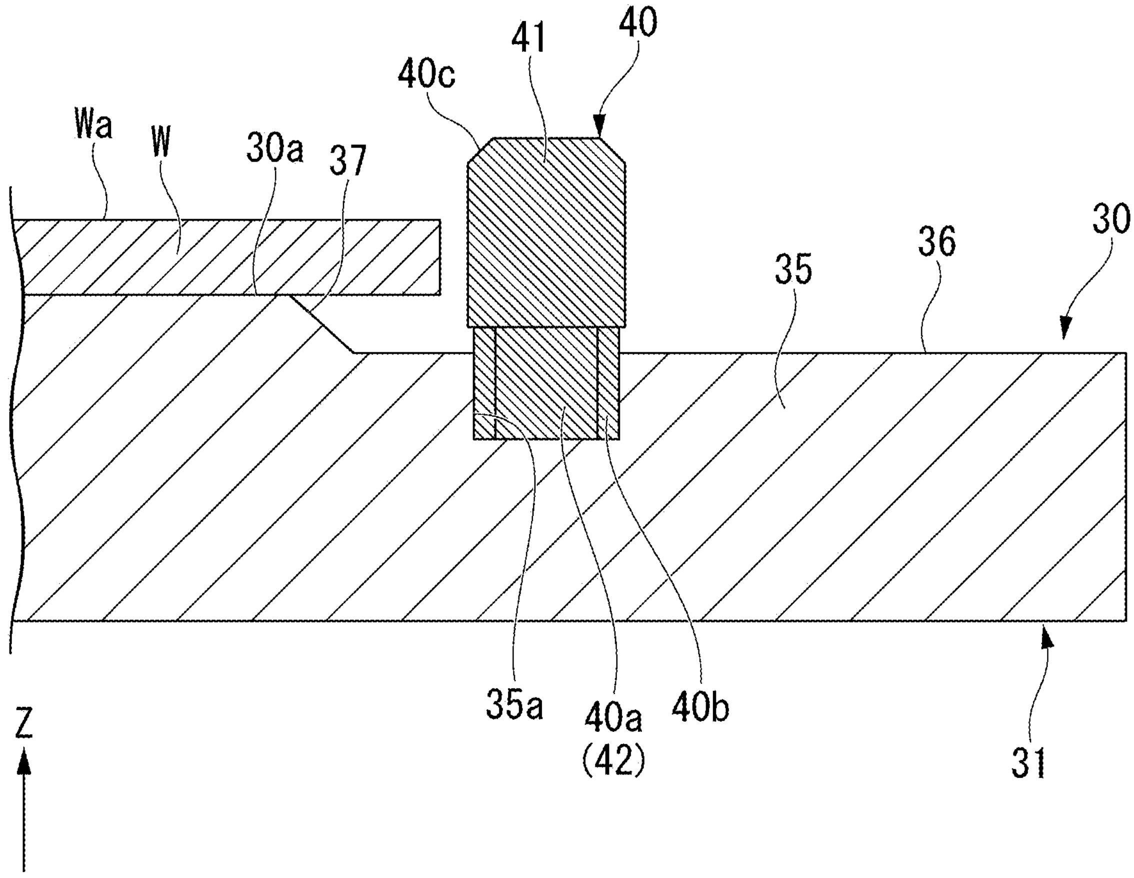
FIG. 13 is a cross-sectional view showing part of the susceptor and part of the wafer guide portion according to the second embodiment.

FIG. 12 is a view of the susceptor 30 according to a second embodiment viewed from above. FIG. 13 is a cross-sectional view showing part of the susceptor 30 and part of the wafer guide portions 40 according to the second embodiment. In FIG. 12, the outer shape of the wafer W is indicated by a two-dot dashed line. As shown in FIG. 12, each of the wafer guide portions 40 has a protrusion portion 41 having substantially a rectangular shape when viewed in the vertical direction Z. As shown in FIG. 13, the main body portion 40*a* has the protrusion portion 41 positioned above, and a columnar portion 42 positioned below. The outer diameter of the columnar portion 42 is smaller than the inner diameters of the fixing hole portions 35*a*. The outer circumferential surface of the columnar portion 42 is disposed away from the inner surfaces of the fixing hole portions 35*a*. The outer circumferential surface of the columnar portion 42 is provided with the projection portions 40*b*. The upward parts of the columnar portion 42 and the projection portions 40*b* are positioned above the fixing hole portions 35*a*. The protrusion portion 41 is positioned above the columnar portion 42 and the projection portions 40*b*. The protrusion portion 41 is positioned above the upper surface 36 of the guide support portion 35.

As shown in FIG. 12, in the protrusion portion 41, the side extending in the radial direction when viewed in the vertical direction Z is parallel to the direction in which the rotation axis R and each of the wafer guide portions 40 are connected. In the protrusion portion 41, the side positioned on the radially outward side from the columnar portion 42 is orthogonal to the direction in which the rotation axis R and each of the wafer guide portions 40 are connected. In the protrusion portion 41, the radially inward side when viewed in the vertical direction Z is a curved surface 41*a* having an arc shape. On the curved surface 41*a*, the center in the circumferential direction when viewed in the vertical direction Z is positioned on the inscribed circle 35*b*. When viewed in the vertical direction Z, the curved surface 41*a* has an arc shape having the same radius as the radius of the wafer W. Each of the wafer guide portions 40 has a constitution similar to that of the wafer guide portion 40 in the first embodiment except that the columnar portion 42 and the protrusion portion 41 above the projection portion 40*b* are provided.

The wafer guide portions 40 of the first embodiment have a constitution in which the main body portion 40*a* having a circular shape when viewed in the vertical direction Z is in point contact with the outer edge of the wafer W having a circular shape. Since the wafer W is in point contact with the main body portion 40*a*, it is likely to break due to concentration of stress even in different from the cleavage directions. In the wafer guide portions 40 of the second embodiment, since the curved surface 41*a* on the radially inward side has an arc shape having the same radius as the radius of the wafer W when viewed in the vertical direction Z, the curved surface 41*a* and the outer edge of the wafer W are in line contact with each other. Since the contact area between the curved surface 41*a* and the outer edge of the wafer W increases, concentration of stress in the wafer W is relaxed and breakage can be curbed.

Third Embodiment

Figure 14:
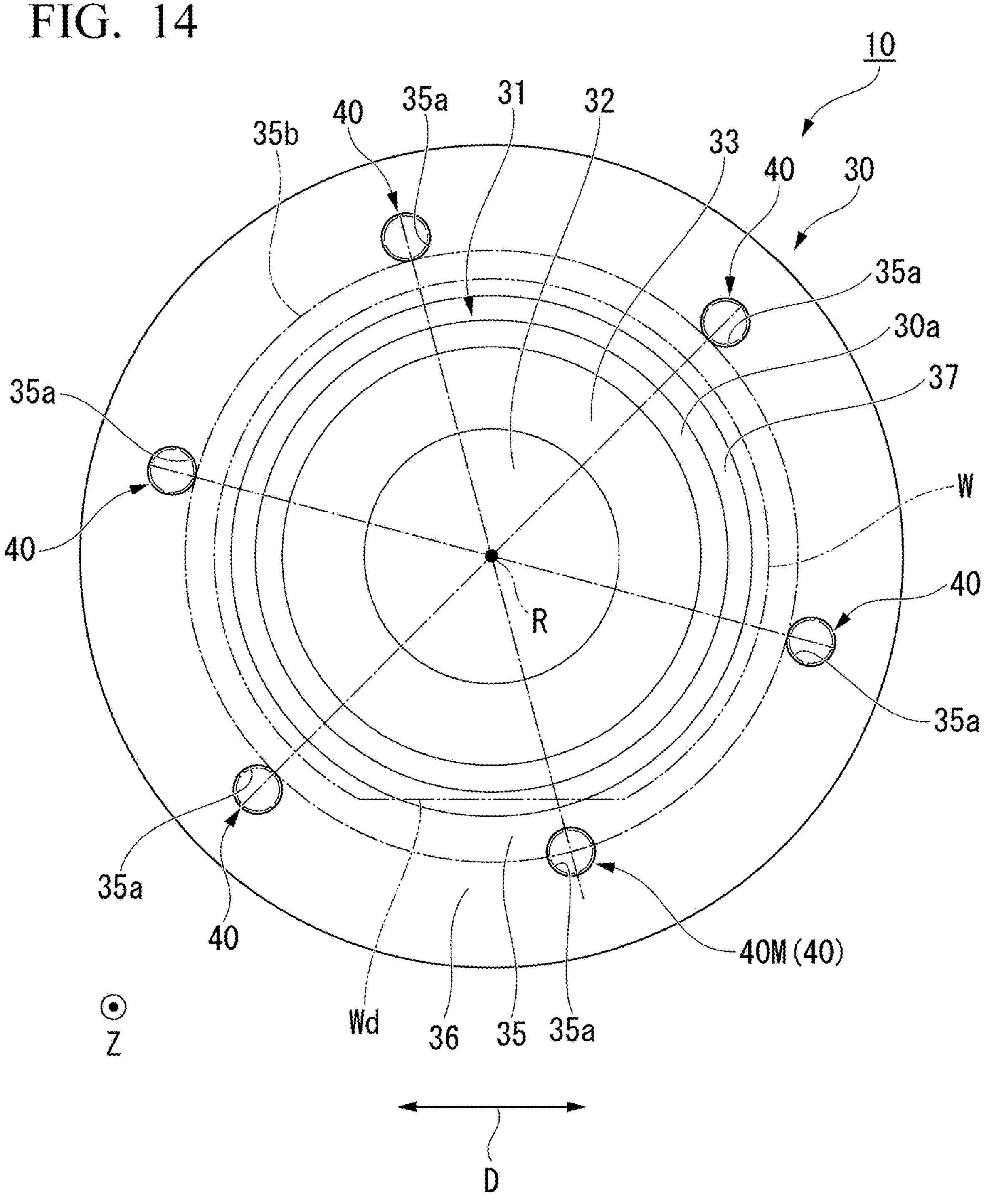
FIG. 14 is a view of the susceptor according to a third embodiment viewed from above.

FIG. 14 is a view of the susceptor 30 according to a third embodiment viewed from above. The wafer guide portion 40M of the first embodiment has a constitution having the mark portion M as an index indicating the predetermined direction D. As shown in FIG. 14, the wafer guide portion 40M is similar to that of the wafer guide portion 40 in the first embodiment except that the position in the radial direction differs from that of other wafer guide portions 40. In the first embodiment, the predetermined direction D in which the orientation flat portion Wd extends is constituted to be indicated by the extending direction of the groove of the mark portion M of the wafer guide portion 40. The five wafer guide portions 40 other than the wafer guide portion 40M circumscribe the inscribed circle 35*b*. However, the wafer guide portion 40M is disposed on the radially inward side from the position circumscribing the inscribed circle 35*b*, which serves as an index indicating the predetermined direction D.

In Step S110, the control unit 90 causes the wafer W to be mounted on the movable portion 32 such that the direction connecting the wafer guide portion 40M, the radial position of which is different from that of the other wafer guide portions 40, and the rotation axis R intersects the predetermined direction D at an angle set in advance. Accordingly, the plurality of wafer guide portions 40 and 40M and the wafer W surrounded by the plurality of wafer guide portions 40 and 40M have the disposition relationship shown in FIGS. 3, 8, and 9. The wafer guide portion 40M of the first embodiment requires processing of the mark portion M. However, the wafer guide portion 40M according to the third embodiment does not require processing of the mark portion M, and therefore the costs of the film formation processing can be reduced.

According to at least one embodiment described above, the film formation method is a film formation method for forming a film on a surface of a wafer using a vapor phase growth apparatus. The film formation method of the embodiment includes film formation processing of forming a film on a surface of a wafer. The vapor phase growth apparatus has a susceptor supporting the wafer, and a plurality of wafer guide portions surrounding the wafer. The susceptor is rotated around the rotation axis extending in the vertical direction. The plurality of wafer guide portions are disposed with an interval therebetween in the circumferential direction around the rotation axis and protrude upward beyond the susceptor. The film formation processing includes surrounding the wafer with the plurality of wafer guide portions such that each direction in which the rotation axis and each of the wafer guide portions are connected when viewed in the vertical direction becomes different from the cleavage direction in the wafer. Accordingly, as described above, deterioration in film formation characteristics of the film formed on the wafer can be curbed. In addition, breakage of the wafer during the film formation processing can be curbed.

As long as at least part on the outer circumferential surface in part of the wafer guide portion positioned inside the fixing hole portion is disposed away from the inner surface of the fixing hole portion, each of the plurality of wafer guide portions may be fixed in any manner inside each of the plurality of fixing hole portions.

The entire outer circumferential surface in part of the wafer guide portion positioned inside the fixing hole portion may come into contact with the inner surface of the fixing hole portion. The wafer guide portion may not be a body separated from the base portion and may be formed integrally with the base portion. Even in these cases, since the plurality of wafer guide portions are disposed with an interval therebetween in the circumferential direction, as described above, deterioration in film formation characteristics of the film formed on the wafer can be curbed. In addition, since each direction in which the rotation axis and each of the wafer guide portions are connected when viewed in the vertical direction is different from the cleavage direction in the wafer, breakage of the wafer can be curbed during the film formation processing.

Figure 15:
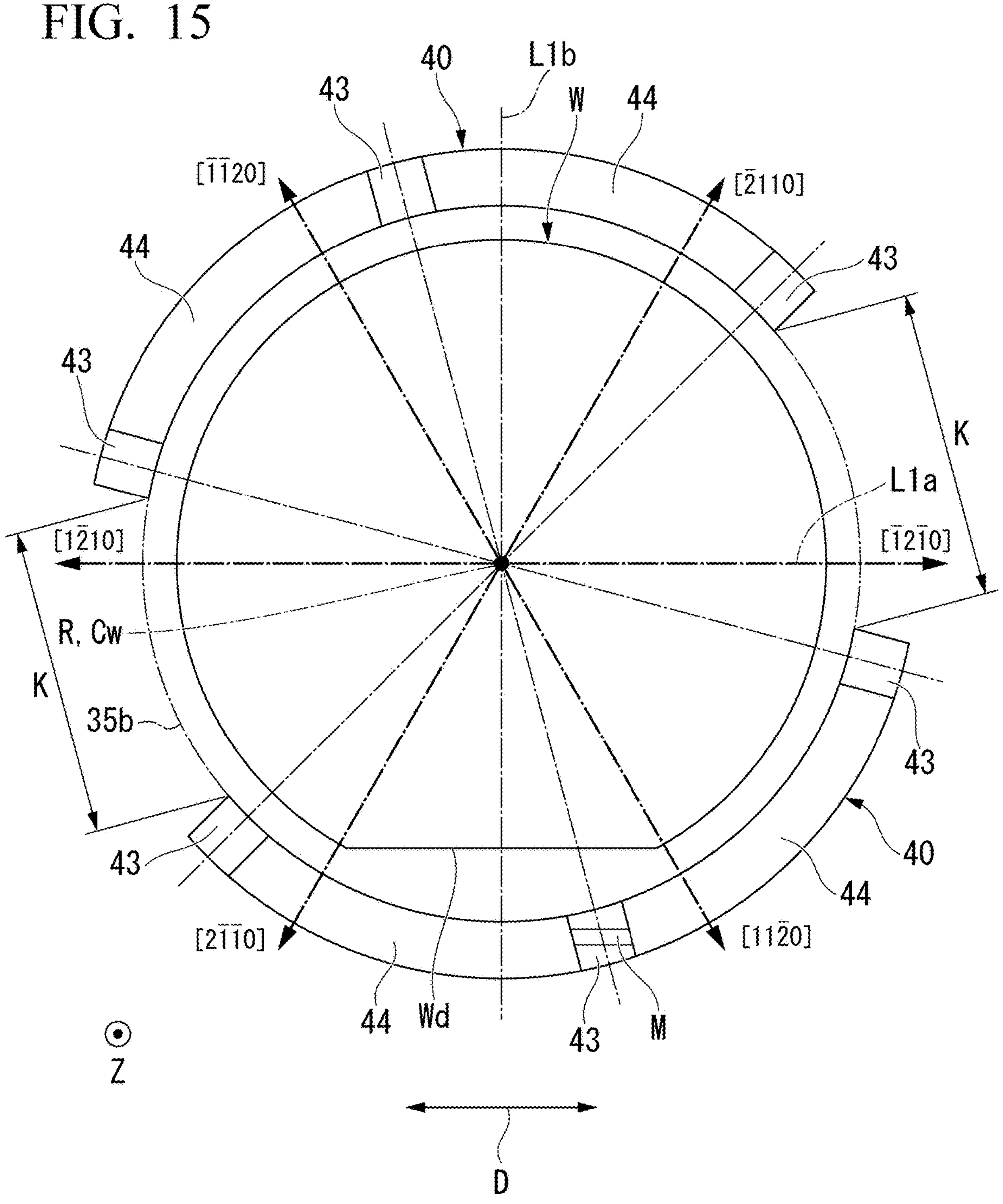
FIG. 15 is a view showing a disposition relationship between the crystal orientations of the wafer and the plurality of wafer guide portions of a modification example of the first embodiment.

In addition, the number of the plurality of wafer guide portions 40 is not limited to six as long as the number is two or larger. The number of the plurality of wafer guide portions 40 may be two as in the wafer guide portions 40 shown in FIG. 15 as a modification example of the first embodiment. Each of the wafer guide portions 40 shown in FIG. 15 has an arc shape extending in the circumferential direction when viewed in the vertical direction Z. The radially inward side of each of the wafer guide portions 40 has an arc shape positioned on the inscribed circle 35*b* when viewed in the vertical direction Z. The two wafer guide portions 40 are disposed point symmetrically about the rotation axis R. If a largest gap K between the two wafer guide portions 40 when viewed in the vertical direction Z is smaller than the diameter of the wafer W, flying out of the wafer W from the gap can be curbed. Each of the wafer guide portions 40 has first parts 43 and second parts 44. The upward surfaces of the first parts 43 are positioned above the surface Wa of the wafer W. Since the upward surfaces of the first parts 43 are positioned above the surface Wa of the wafer W and the radially inward side has an arc shape when viewed in the vertical direction Z, flying out of the wafer W can be curbed, and since the contact area when the wafer W comes into contact increases, concentration of stress in the wafer W is relaxed. The upward surfaces of the second parts 44 are flush with the surface Wa of the wafer W or positioned below the surface Wa. Since the upward surfaces of the second parts 44 are flush with the surface Wa of the wafer W or positioned below the surface Wa, a hindrance to a flow of the source gas can be curbed. In each of the wafer guide portions 40, three first parts 43 are disposed with an interval therebetween in the circumferential direction. In each of the wafer guide portions 40, two second parts 44 are disposed while being positioned between the first parts 43. The positions of the first parts 43 in the circumferential direction are disposed in different from the cleavage direction in the wafer W in which the wafer guide portions 40 are disposed in the first embodiment and at positions different from those on the straight line L1*a* and on the straight line L1*b*. As a result, breakage of the wafer W can be curbed. Since the positions of the first parts 43 in the circumferential direction are disposed at positions different from those on the straight line L1*a* and on the straight line L1*b*, measurement of the film thickness and the carrier concentration of the parts surrounded by the plurality of first parts 43 during the film formation processing in the wafer W is curbed.

The material constituting the plurality of wafer guide portions 40 may differ from the material constituting the base portion of the susceptor. In this case, the heat conductivity of the plurality of wafer guide portions 40 may be lower than the heat conductivity of the base portion of the susceptor. In this case, transmission of heat from the base portion of the susceptor to the plurality of wafer guide portions 40 can be further curbed. Accordingly, increase in temperature in the parts which have come into contact with the plurality of wafer guide portions 40 in the wafer can be further curbed. When the heat conductivity of the plurality of wafer guide portions 40 is lower than the heat conductivity of the base portion of the susceptor, graphite, SiC, SiN, or the like may be employed as the material constituting the plurality of wafer guide portions 40, for example. The material constituting the plurality of wafer guide portions 40 may be single crystal SiC having the same hexagonal crystal structure as the wafer W. When the material constituting the wafer guide portions 40 is the same as that of the wafer W, deposits which have adhered to the wafer guide portions 40 in the film formation processing are unlikely to peel off. For this reason, a situation in which deposits which have adhered to the wafer guide portions 40 fall down on the support surface 30*a* and are pinched between the wafer W and the wafer guide portions 40 can be curbed. When the wafer guide portions 40 are produced using single crystal SiC having a hexagonal crystal structure, for example, SiC ingot produced by a sublimation method is prepared, and the prepared SiC ingot may be processed in accordance with the shapes of the wafer guide portions 40 described above.

The mark portion may have any shape as long as the predetermined direction in which the orientation flat portion is aligned can be indicated and may be formed at any spot of the wafer guide portions. The mark portion may not be formed in the wafer guide portions.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wafer support structure comprising:

a susceptor provided in a vapor phase growth apparatus, supporting a wafer, and rotated around a rotation axis extending in a vertical direction; and a plurality of wafer guide portions disposed with an interval therebetween in a circumferential direction around the rotation axis, protruding upward beyond the susceptor, and surrounding the wafer, wherein one of the wafer guide portions includes an index indicating a predetermined direction orthogonal to the vertical direction, and a direction in which the rotation axis and each of the wafer guide portions are connected when viewed in the vertical direction is different from the predetermined direction and is also different from a direction inclined with respect to the predetermined direction by 60°.

2. The wafer support structure according to claim 1, wherein the index is a position in a radial direction about the rotation axis at which one of the wafer guide portions is disposed differently from the remaining wafer guide portions.

3. The wafer support structure according to claim 1, wherein the susceptor has a plurality of fixing hole portions opening upward and disposed with an interval therebetween in the circumferential direction, the plurality of wafer guide portions are respectively fixed to insides of the plurality of fixing hole portions and respectively protrude upward from the insides of the plurality of fixing hole portions, and at least part of each of the wafer guide portions on an outer circumferential surface of a part positioned inside the fixing hole portion is disposed away from an inner surface of the fixing hole portion facing the outer circumferential surface of the part positioned inside the fixing hole portion.

4. The wafer support structure according to claim 3, wherein each of the plurality of wafer guide portions has a main body portion extending in the vertical direction, and a projection portion provided on the outer circumferential surface of the main body portion, and the projection portion comes into contact with the inner surface of the fixing hole portion.

5. The wafer support structure according to claim 1, wherein the susceptor has a guide support portion supporting the plurality of wafer guide portions from below on a radially outward side about the rotation axis beyond a support surface supporting the wafer, and the guide support portion is positioned below the support surface.

6. The wafer support structure according to claim 1, wherein a heat conductivity of the plurality of wafer guide portions is lower than a heat conductivity of the susceptor.

7. A vapor phase growth apparatus comprising:

a wafer support structure;

a drive unit rotating a susceptor around a rotation axis; and a heating portion capable of heating the susceptor, wherein the wafer support structure includes the susceptor supporting a wafer and rotated around the rotation axis extending in a vertical direction, and a plurality of wafer guide portions disposed with an interval therebetween in a circumferential direction around the rotation axis, protruding upward beyond the susceptor, and surrounding the wafer, one of the wafer guide portions includes an index indicating a predetermined direction orthogonal to the vertical direction, and a direction in which the rotation axis and each of the wafer guide portions are connected when viewed in the vertical direction is different from the predetermined direction and is also different from a direction inclined with respect to the predetermined direction by 60°.

* * * * *